(12) United States Patent
Wang et al.

(10) Patent No.: US 11,996,483 B2
(45) Date of Patent: *May 28, 2024

(54) FET WITH WRAP-AROUND SILICIDE AND FABRICATION METHODS THEREOF

(71) Applicant: Taiwan Semiconductor Manufacturing Co., Ltd., Hsin-Chu (TW)

(72) Inventors: Pei-Hsun Wang, Kaohsiung (TW); Chih-Chao Chou, Hsinchu (TW); Shih-Cheng Chen, New Taipei (TW); Jung-Hung Chang, Changhua County (TW); Jui-Chien Huang, Hsinchu (TW); Chun-Hsiung Lin, Hsinchu County (TW); Chih-Hao Wang, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/066,141

(22) Filed: Dec. 14, 2022

(65) Prior Publication Data

US 2023/0145872 A1     May 11, 2023

Related U.S. Application Data

(60) Continuation of application No. 17/193,732, filed on Mar. 5, 2021, now Pat. No. 11,695,076, which is a
(Continued)

(51) Int. Cl.
| | | |
|---|---|---|
| *H01L 29/786* | (2006.01) | |
| *H01L 21/02* | (2006.01) | |
| (Continued) | | |

(52) U.S. Cl.
CPC .. *H01L 29/78618* (2013.01); *H01L 21/02532* (2013.01); *H01L 21/02603* (2013.01);
(Continued)

(58) Field of Classification Search
CPC ......... H01L 29/78618; H01L 21/02532; H01L 21/02603; H01L 21/28518; H01L 29/0653;
(Continued)

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| (Continued) | | |

*Primary Examiner* — Quoc D Hoang
(74) *Attorney, Agent, or Firm* — Haynes and Boone, LLP

(57) ABSTRACT

The present disclosure provides a semiconductor device that includes a semiconductor fin disposed over a substrate, an isolation structure at least partially surrounding the fin, an epitaxial source/drain (S/D) feature disposed over the semiconductor fin, where an extended portion of the epitaxial S/D feature extends over the isolation structure, and a silicide layer disposed on the epitaxial S/D feature, where the silicide layer covers top, bottom, sidewall, front, and back surfaces of the extended portion of the S/D feature.

20 Claims, 33 Drawing Sheets

Related U.S. Application Data division of application No. 16/582,547, filed on Sep. 25, 2019, now Pat. No. 10,944,009.

(60) Provisional application No. 62/753,466, filed on Oct. 31, 2018.

(51) Int. Cl.
| | | |
|---|---|---|
| *H01L 21/285* | (2006.01) | |
| *H01L 29/06* | (2006.01) | |
| *H01L 29/423* | (2006.01) | |
| *H01L 29/45* | (2006.01) | |
| *H01L 29/66* | (2006.01) | |

(52) U.S. Cl.
CPC .... *H01L 21/28518* (2013.01); *H01L 29/0653* (2013.01); *H01L 29/0673* (2013.01); *H01L 29/42392* (2013.01); *H01L 29/45* (2013.01); *H01L 29/66545* (2013.01); *H01L 29/66742* (2013.01); *H01L 29/78684* (2013.01); *H01L 29/78696* (2013.01)

(58) Field of Classification Search
CPC ........... H01L 29/0673; H01L 29/42392; H01L 29/45; H01L 29/66545; H01L 29/66742; H01L 29/78696
USPC ........................................................ 257/347
See application file for complete search history.

(56) References Cited

U.S. PATENT DOCUMENTS

| | | | |
|---|---|---|---|
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 11,695,076 | B2 * | 7/2023 | Wang ............... H01L 29/42392 257/347 |
| 2009/0026505 | A1 | 1/2009 | Okano |
| 2014/0335673 | A1 | 11/2014 | Kim et al. |
| 2019/0312117 | A1 * | 10/2019 | Qi .................... H01L 21/02614 |
| 2020/0135932 | A1 | 4/2020 | Wang et al. |

\* cited by examiner

FET WITH WRAP-AROUND SILICIDE AND FABRICATION METHODS THEREOF

CROSS-REFERENCE TO RELATED APPLICATIONS

This is a continuation application of U.S. patent application Ser. No. 17/193,732, filed on Mar. 5, 2021, which is a divisional application of U.S. patent application Ser. No. 16/582,547, filed on Sep. 25, 2019, which further claims priority to U.S. Provisional Patent Application Ser. No. 62/753,466, filed on Oct. 31, 2018, each of which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed. For example, reducing contact resistance between source/drain (S/D) features and metal contacts of source/drain features becomes more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
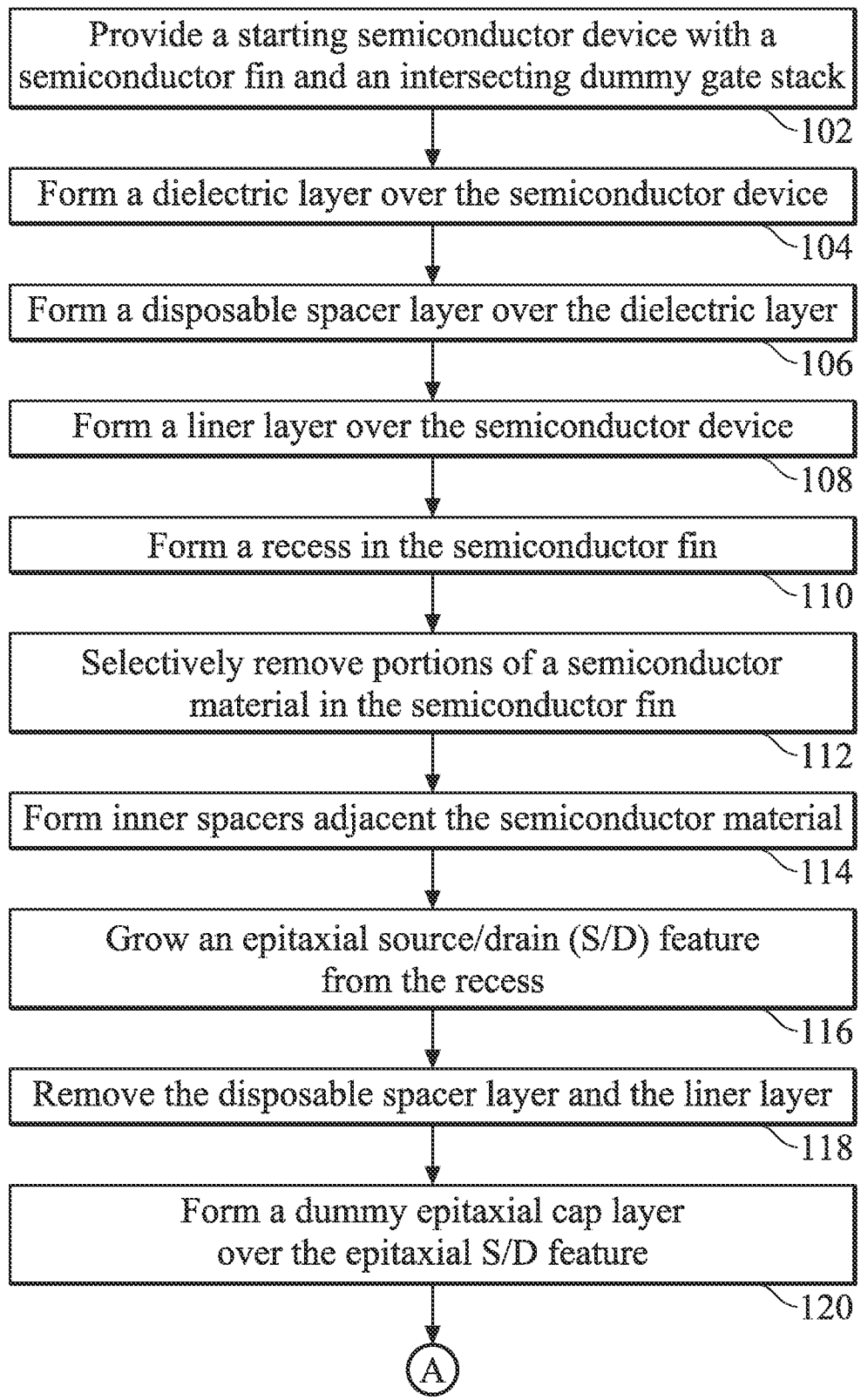
FIGS. 1A and 1B illustrate a flowchart of an example method for making a semiconductor device in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating field-effect transistors (FETs), such as fin-like FETs (FinFETs), gate-all-around FETs (GAA FETs), and/or other FETs.

In semiconductor fabrication, a silicide contact layer (hereafter called a silicide layer) is formed over a top surface of an epitaxial source/drain (S/D) feature after a contact trench is formed over the epitaxial S/D feature. As a result, a surface area of the silicide layer may be restricted to only a top portion of the epitaxial S/D feature, thereby limiting a contact area between the silicide layer and the S/D contact.

Therefore, for at least these reasons, improvements in methods of forming silicide layers are desired.

The present disclosure provides a silicide layer that is sandwiched between an epitaxial S/D feature and an S/D contact and designed to reduce contact resistance between the epitaxial S/D feature and the S/D contact. According to some embodiments, a dummy epitaxial cap layer is formed over an epitaxial S/D feature and wraps around at least a portion the epitaxial S/D feature that extends over an isolation structure. After a gate replacement process, the dummy epitaxial cap layer is removed and replaced by a silicide layer. As a result, the silicide layer also wraps around at least the portion the epitaxial S/D feature that extends over an isolation structure, thereby increasing a contact area between the silicide layer and the S/D contact. In addition, since the silicide layer is formed post-gate replacement, it does not go through the chemicals and thermal processes involved in the gate replacement process, which allows the silicide layer to retain more consistent properties.

Figure 1B:
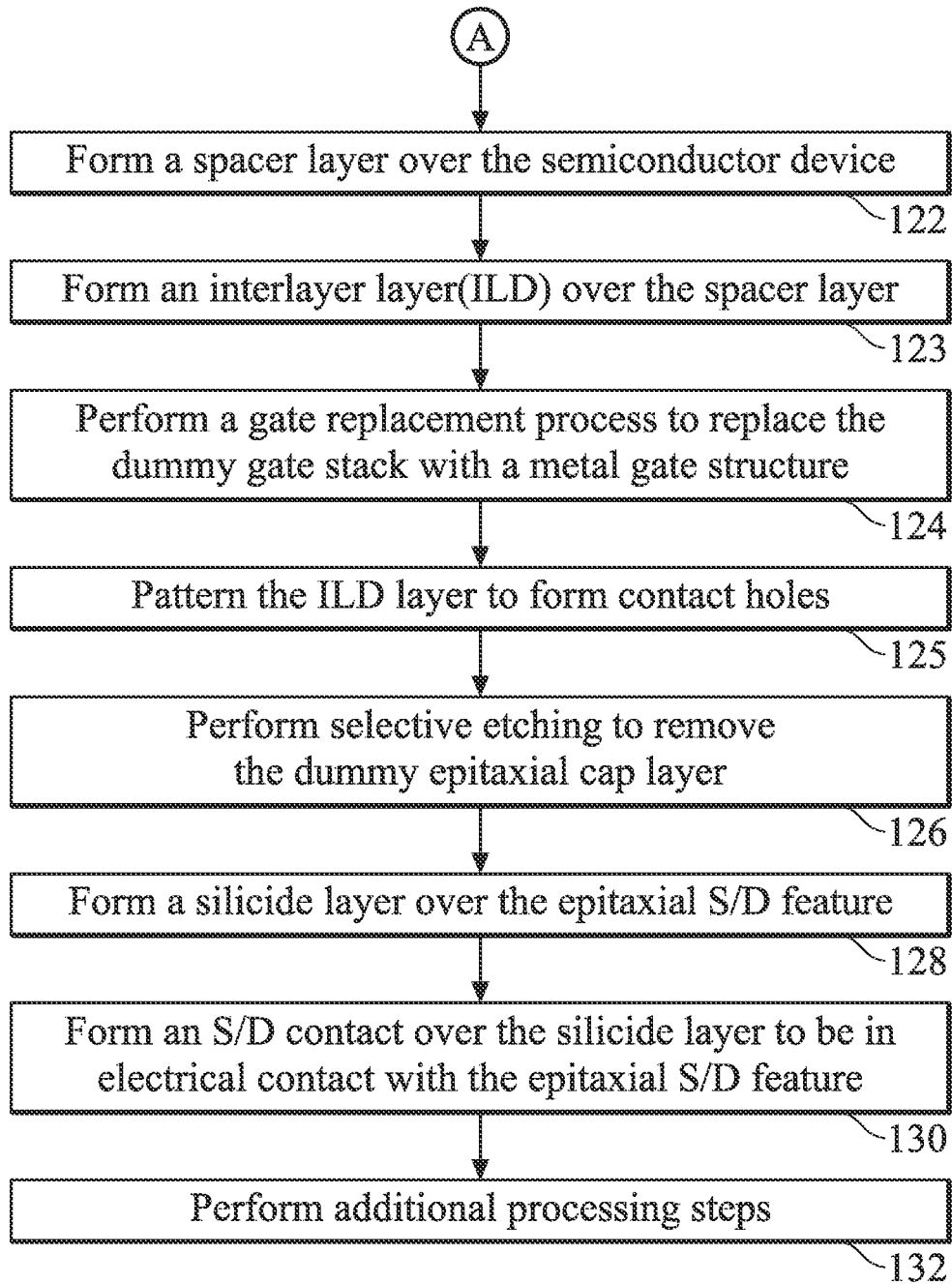
Figure 2A:
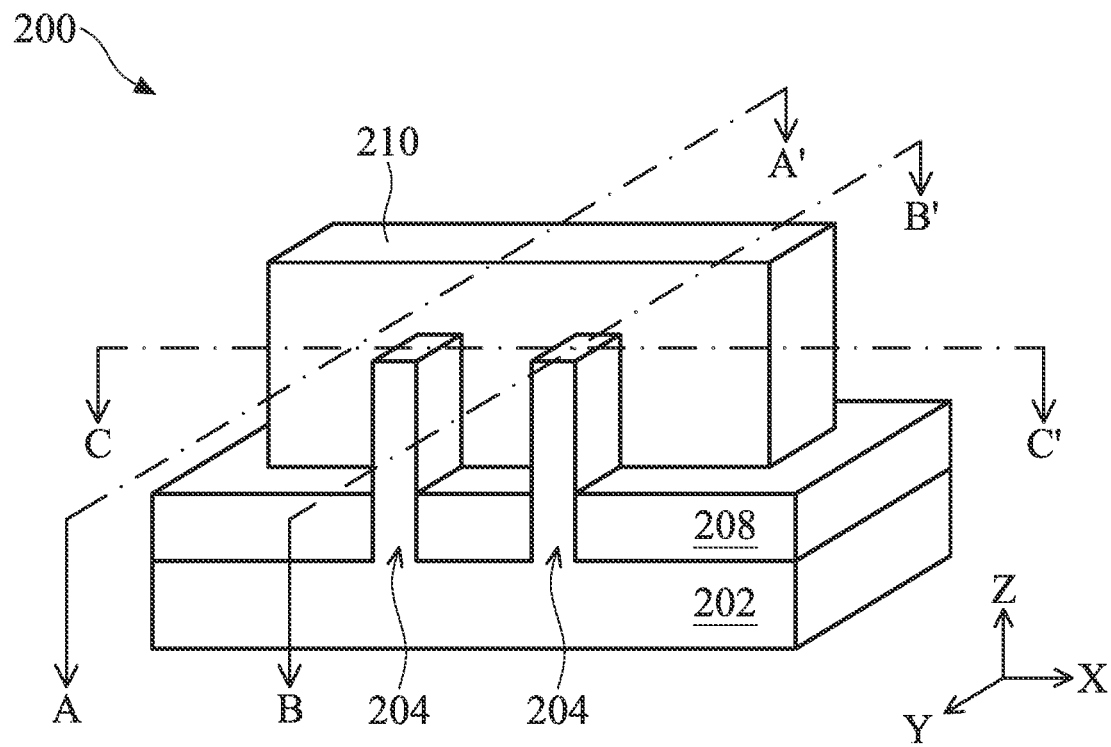
FIG. 2A illustrates a three-dimensional perspective view of an example semiconductor device in accordance with some embodiments of the present disclosure.
Figure 2B:
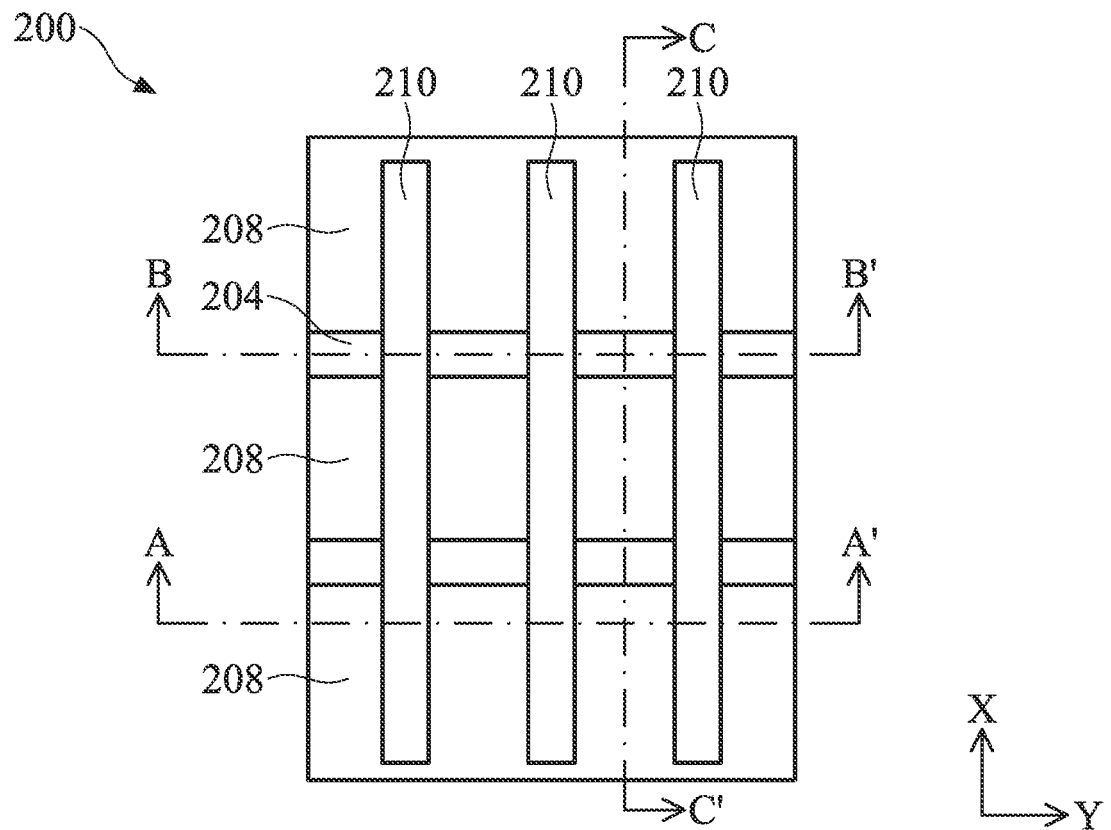
FIG. 2B illustrates a planar top view of an example semiconductor device in accordance with some embodiments of the present disclosure.

FIG. 1 illustrates a flow chart of a method 100 for forming a semiconductor device 200 (hereafter called "device 200" in short) in accordance with some embodiments of the present disclosure. The method 100 is merely an example and is not intended to limit the present disclosure beyond what is explicitly recited in the claims. Additional operations can be performed before, during, and after the method 100, and some operations described can be replaced, eliminated, or moved around for additional embodiments of the method. The method 100 is described below in conjunction with other figures, which illustrate various three-dimensional and cross-sectional views of the device 200 during intermediate steps of the method 100. In particular, FIG. 2A illustrates a three-dimensional view of the device 200; FIG. 2B illustrates a planar top view of the device 200; FIGS. 3A, 4A, 5A, 6A, 7A, 8A, 9A, 10A, 11A, and 12A illustrate cross-sectional views of the device 200 taken along line AA' as shown in FIGS. 2A and 2B (that is, X-cut off fin); FIGS. 3B, 4B, 5B, 6B, 7B, 8B, 9B, 10B, 11B, and 12B illustrate cross-sectional views of the device 200 taken along line BB' as shown in FIGS. 2A and 2B (that is, X-cut on fin); and FIGS. 3C, 4C, 5C, 6C, 7C, 8C, 9C, 10C, 11C, and 12C illustrate cross-sectional views of the device 200 taken along line CC' as shown in FIGS. 2A and 2B (that is, Y-cut).

The device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), fin-like FETs (FinFETs), metal-oxide semiconductor field effect transistors (MOSFET), complementary metal-oxide semiconductor (CMOS) transistors, bipolar transistors, high voltage transistors, high frequency transistors, and/or other memory cells The present disclosure is not limited to any particular number of devices or device regions, or to any particular device configurations. For example, though the device 200 as illustrated is a three-dimensional FET device (e.g., a FinFET or a GAA FET), the present disclosure may also provide embodiments for fabricating planar FET devices.

Referring to FIGS. 1 and 2A-2B, the method 100 at operation 102 provides the device 200 that includes one or more semiconductor fins 204 protruding from a substrate 202 and separated by isolation structures 208 and a dummy gate stack 210 disposed over the substrate 202. The device 200 may include other components, such as gate spacers (not included) disposed on sidewalls of the dummy gate stack 210, various hard mask layers disposed over the dummy gate stack 210 (discussed in detail below), barrier layers, other suitable layers, or combinations thereof.

The substrate 202 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (an) substrate having a silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions, such as source/drain regions, are disposed in or on the substrate 202. The doped regions may be doped with p-type dopants, such as phosphorus or arsenic, and/or n-type dopants, such as boron or $BF_2$, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

Each semiconductor fin 204 may be suitable for providing an n-type FET or a p-type FET. In some embodiments, the semiconductor fins 204 as illustrated herein may be suitable for providing FinFETs of a similar type, i.e., both n-type or both p-type. Alternatively, they may be suitable for providing FinFETs of opposite types, i.e., an n-type and a p-type. This configuration is for illustrative purposes only and is not intended to be limiting. The semiconductor fins 204 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the semiconductor fins 204 on the substrate 202. The etching process may include dry etching, wet etching, reactive ion etching (RIE), and/or other suitable processes.

Numerous other embodiments of methods for forming the semiconductor fins 204 may be suitable. For example, the semiconductor fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. In some embodiments, after its formation, the fins 204 have a height (denoted as H_fin in FIG. 3B) between about 40 to about 70 nm. This height will effectively affect the device performance and operation current (Ion). Higher fin/nanosheet may help to provide greater operation current but with the trade of AC penalty (speed degradation). Furthermore, higher fin/nanosheet may also be limited by the patterning process. For GAA structure (nanosheet), height will also be limited by the sheet-sheet space (correlated to 204B thickness) at metal gate formation.

Figure 3A:
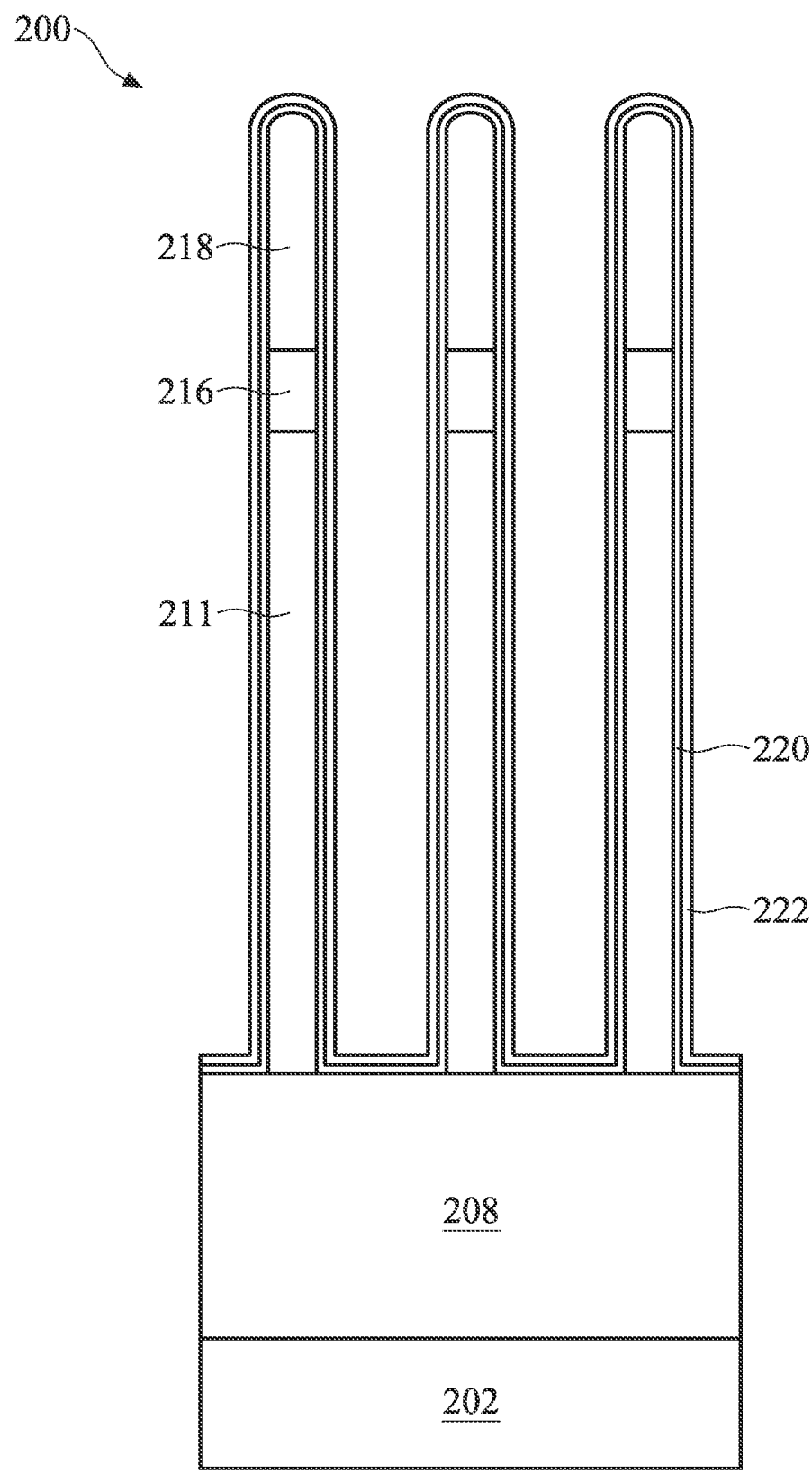
FIGS. 3A, 4A, 5A, 6A, 7A, 8A, 9A, 10A, 11A, and 12A illustrate cross-sectional views of the semiconductor device of FIGS. 2A and 2B taken along line AA' at intermediate stages of an embodiment of the method of FIG. 1 in accordance with some embodiments of the present disclosure.
Figure 3B:
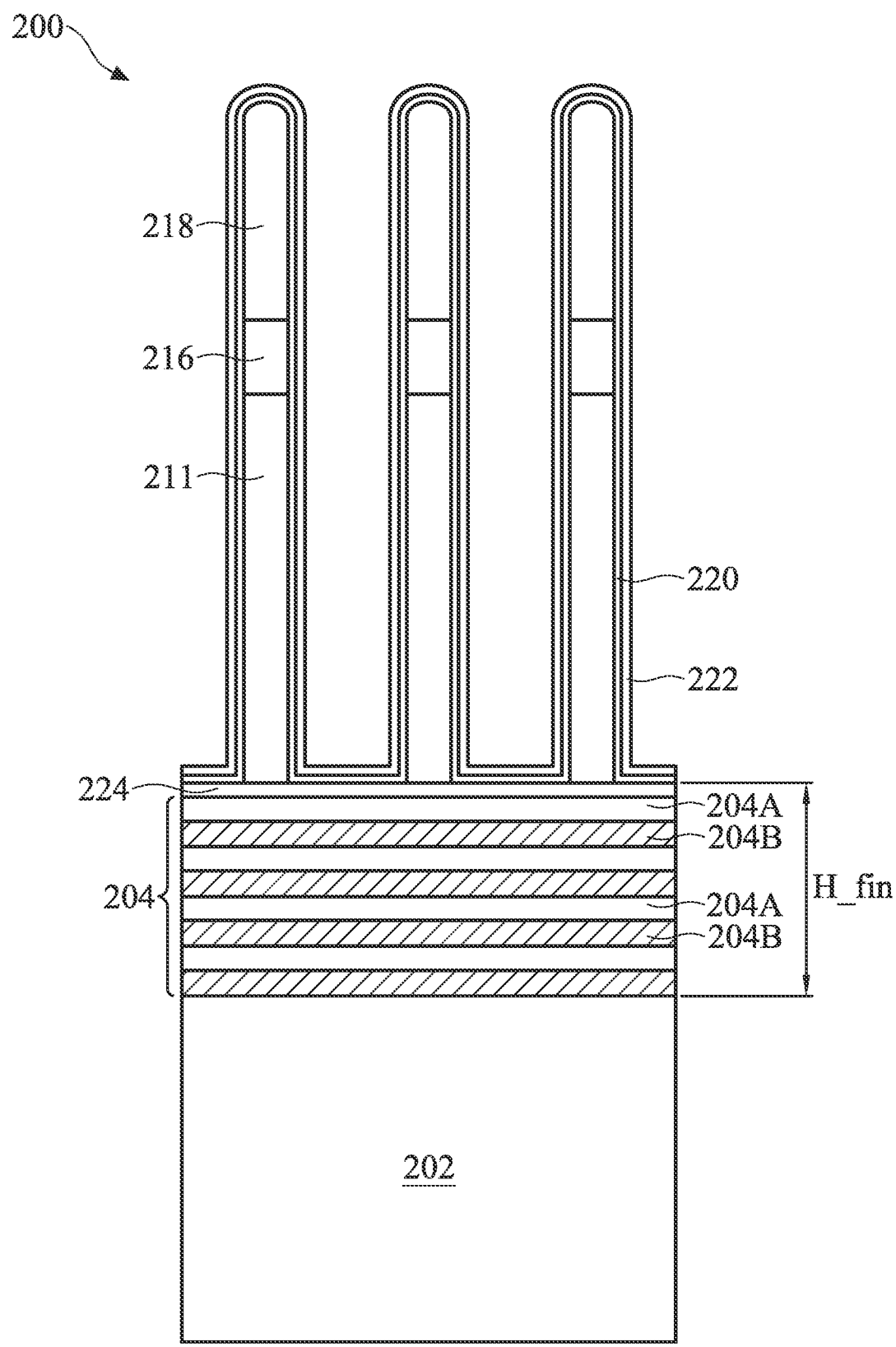
FIGS. 3B, 4B, 5B, 6B, 7B, 8B, 9B, 10B, 11B, and 12B illustrate cross-sectional views of the semiconductor device of FIGS. 2A and 2B taken along line BB' at intermediate stages of an embodiment of the method of FIG. 1 in accordance with some embodiments of the present disclosure.
Figure 3C:
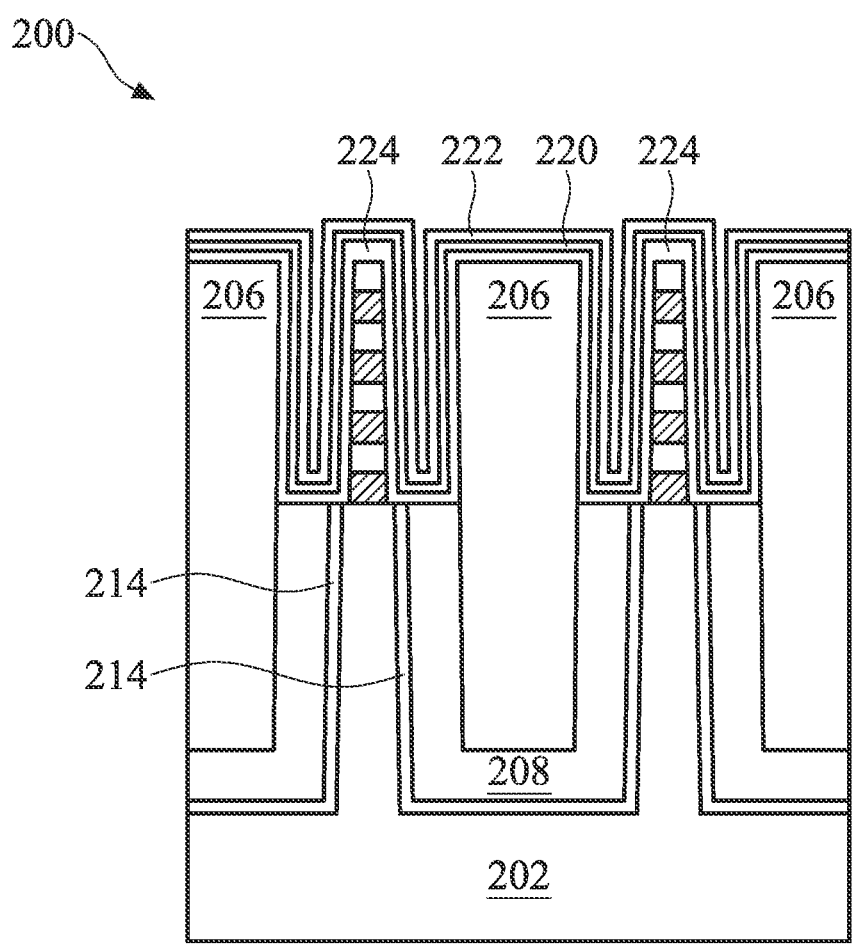
FIGS. 3C, 4C, 5C, 6C, 7C, 8C, 9C, 10C, 11C, and 12C illustrate cross-sectional views of the semiconductor device of FIGS. 2A and 2B taken along line CC' at intermediate stages of an embodiment of the method of FIG. 1 in accordance with some embodiments of the present disclosure.

In the depicted embodiment, referring to FIGS. 3B and 3C for example, the semiconductor fin 204 may include alternating layers of semiconductor materials, e.g., semiconductor material 204A and semiconductor material 204B that is different from the semiconductor material 204B. In some example embodiments, the semiconductor fin 204 may include a total of three to ten alternating layers of semiconductor materials; of course, the present disclosure is not limited to such configuration. In the present disclosure, the semiconductor material 204A includes Si, while the semiconductor material 204B includes SiGe. Either of the semiconductor materials 204A and 204B (or both) may be doped with a suitable dopant, such as a p-type dopant or an n-type dopant, for forming desired FETs. The semiconductor materials 204A and 204B may each be formed by an epitaxial process, such as, for example, a molecular beam epitaxy (MBE) process, a CVD process such as a metal organic CVD (MOCVD) process, and/or other suitable epitaxial growth processes.

In many embodiments, alternating layers of the semiconductor materials 204A and 204B are configured to provide multi-gate devices such as GAA FETs, the details of forming which are provided below. Multi-gate devices have been introduced in an effort to improve gate control by increasing gate-channel coupling, reduce OFF-state current, and reduce short-channel effects. A multi-gate device such as a GAA FET generally includes a gate structure that extends around its horizontal channel region, providing access to the channel region on all sides. The GAA FETs are generally compatible with CMOS processes, allowing them to be aggressively scaled down while maintaining gate control and mitigating short-channel effects. Of course, the present disclosure is not limited to forming GAA FETs only and may provide other three-dimensional FETs such as FinFETs. As such, the semiconductor fin 204 may include a single layer of semiconductor material or multiple layers of different semiconductor materials not configured in an alternating stack, such that a uniform fin is provided to form a FinFET.

The isolation structures 208 may include silicon oxide, silicon nitride, silicon oxynitride, fluoride-doped silicate glass (FSG), a low-k dielectric material, and/or other suitable materials. The isolation structures 208 may include shallow trench isolation (STI) features. In one embodiment, the isolation structures 208 are formed by etching trenches in the substrate 202 during the formation of the semiconductor fins 204. The trenches may then be filled with an isolating material described above by a deposition process, followed by a chemical mechanical planarization (CMP) process. Other isolation structure such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers. The isolation structures 208 may be deposited by any suitable method, such as chemical vapor deposition (CVD), flowable CVD (FCVD), spin-on-glass (SOG), other suitable methods, or combinations thereof. The isolation structures 208 may be formed by depositing a dielectric layer as a spacer layer over the semiconductor fins 204 and subsequently recessing the dielectric layer such that a top surface of the isolation structures 208 is below a top surface of the semiconductor fins 204.

In some embodiments, as depicted in FIG. 3C, a fin spacer layer 214 is formed on the sidewalls of the semiconductor fins 204. The fin spacer layer 214 may include any suitable dielectric material, such as silicon nitride, silicon oxide, silicon oxynitride, or other suitable dielectric materials, or combinations thereof. In some embodiments, the fin spacer layer 214 includes a dielectric material different from that of the isolation structures 208 and the dielectric fins 206. The fin spacer layer 214 may be first deposited conformally over the semiconductor fins 204. The dielectric layer for forming the isolation structures 208 is then deposited over the fin spacer layer 214, thereby filling in the space in the fin spacer layer 214. Thereafter, the dielectric layer for forming the isolation structures 208 is recessed as discussed above to form the semiconductor fins 204 with the fins spacers layer 214 remaining on the sidewalls of the semiconductor fins 204.

As depicted herein, the device 200 may optionally include dielectric fins 206 (sometimes called dummy fins or hybrid fins, in some instances) disposed over the substrate 202. Referring to FIG. 3C, for example, each dielectric fin 206 may be disposed between the semiconductor fins 204 and oriented substantially parallel to the semiconductor fins 204. However, unlike the semiconductor fins 204 configured to provide active devices, the dielectric fins 206 are inactive and not configured to form FETs. In some embodiments, the dielectric fins 206 are provided to adjust fin-to-fin spacing (i.e., fin pitch) such that the thicknesses of subsequently formed dielectric layers (e.g., layers 220 and 222) may be controlled according to design requirements. The dielectric fins 206 could also help to release fin patterning loading effect and prevent source/drain EPI bridge. The dielectric fins 206 may be formed by any suitable method. In one example as discussed above, the isolation structures 208 may first be deposited as a spacer layer over sidewalls of the semiconductor fins 204. Before recessing the isolation structures 208 to be lower than the semiconductor fins 204, a dielectric layer for forming the dielectric fins 206 is deposited over sidewalls of the isolation structures 208. Thereafter, the isolation structures 208 are recessed (e.g., by a chemical etching process) such that its top surface is lower than both a top surface of the semiconductor fins 204 and a top surface of the dielectric layer for forming the dielectric fins 206.

In some embodiments, each dummy gate stack 210 serves as a placeholder for subsequently forming a high-k metal gate structure (HKMG; where "high-k" refers to a dielectric constant greater than that of silicon dioxide, which is about 3.9). The dummy gate stack 210 may include a dummy gate electrode 211 and various other material layers. In some embodiments, the dummy gate electrode 211 includes polysilicon. In the depicted embodiment, referring to FIG. 3A, the dummy gate stack may include an interfacial layer 224 disposed between the semiconductor fins 204 and the dummy gate electrode 211, a hard mask layer 216 disposed over the dummy gate electrode 211, and/or a hard mask layer 218 disposed over the hard mask layer 216. As will be discussed in detail below, portions of the dummy gate stack 210 are replaced with the HKMG during a gate replacement process after other components (e.g., the epitaxial S/D features 250) of the device 200 are fabricated. The hard mask layers 216 and 218 may each include any suitable dielectric material, such as a semiconductor oxide and/or a semiconductor nitride. In one example, the hard mask layer 216 includes silicon carbonitride, and the hard mask layer 218 includes silicon oxide. The interfacial layer 224 may include any suitable material, such as silicon oxide. Various material layers of the dummy gate stack 210 may be formed by any suitable process, such as CVD, PVD, ALD, chemical oxidation, other suitable processes, or combinations thereof.

Now referring to FIGS. 1 and 3A-3C, the method 100 at operation 104 forms a dielectric layer 220 over the device 200. In many embodiments, the dielectric layer 220 is formed conformally over the device 200, including the semiconductor fins 204, the dielectric fins 206, and the dummy gate stacks 210. The dielectric layer 220 may include any suitable dielectric material, such as a nitrogen-containing dielectric material, and may be formed by any suitable method, such as ALD, CVD, PVD, other suitable methods, or combinations thereof. In the depicted embodiment, the dielectric layer 220 is formed by a thermal ALD process. In some examples, the dielectric layer 220 may include silicon nitride, silicon carbonitride, silicon oxycarbonitride, other suitable dielectric materials, or combinations thereof.

Still referring to FIGS. 1 and 3A-3C, the method 100 at operation 106 forms a disposable spacer layer 222 over the dielectric layer 220. Similar to the dielectric layer 220, the disposable spacer layer 222 may be formed conformally over the dummy gate stacks 210. Notably, in some cases the presence of the dielectric fins 206 reduces the fin-to-fin spacing as depicted in FIG. 3C. In such cases, the disposable spacer layer 222 may still be formed conformally over the dummy gate stacks 210. But if the fin-to-fin spacing is exceedingly small, the disposable spacer layer 222 may fill fin-to-fin gap(s) formed over the dielectric layer 220. The disposable spacer layer 222 may include any suitable dielectric material, such as an oxygen-containing dielectric material or a high-k dielectric material, and may be formed by any suitable method, such as ALD, CVD, PVD, other suitable methods, or combinations thereof. In some examples, the disposable spacer layer 222 includes silicon oxide, silicon oxycarbide, a high-k dielectric material (e.g., hafnium oxide, zirconium oxide, lanthanum oxide, yttrium oxide, etc.), other suitable dielectric materials, or combinations thereof. Notably, though not limited to any specific values, thicknesses of the layers 220 and 222 may be determined by the fin-to-fin spacing between the semiconductor fins 204 and the dielectric fins 206. In an example, each of the layers 220 and 222 is formed to have a thickness of less than about 10 nm. Furthermore, in some embodiments, the layers 220 and 222 include different compositions, such that an etching selectivity exists between the two material layers when both are subjected to a common etchant.

Figure 4A:
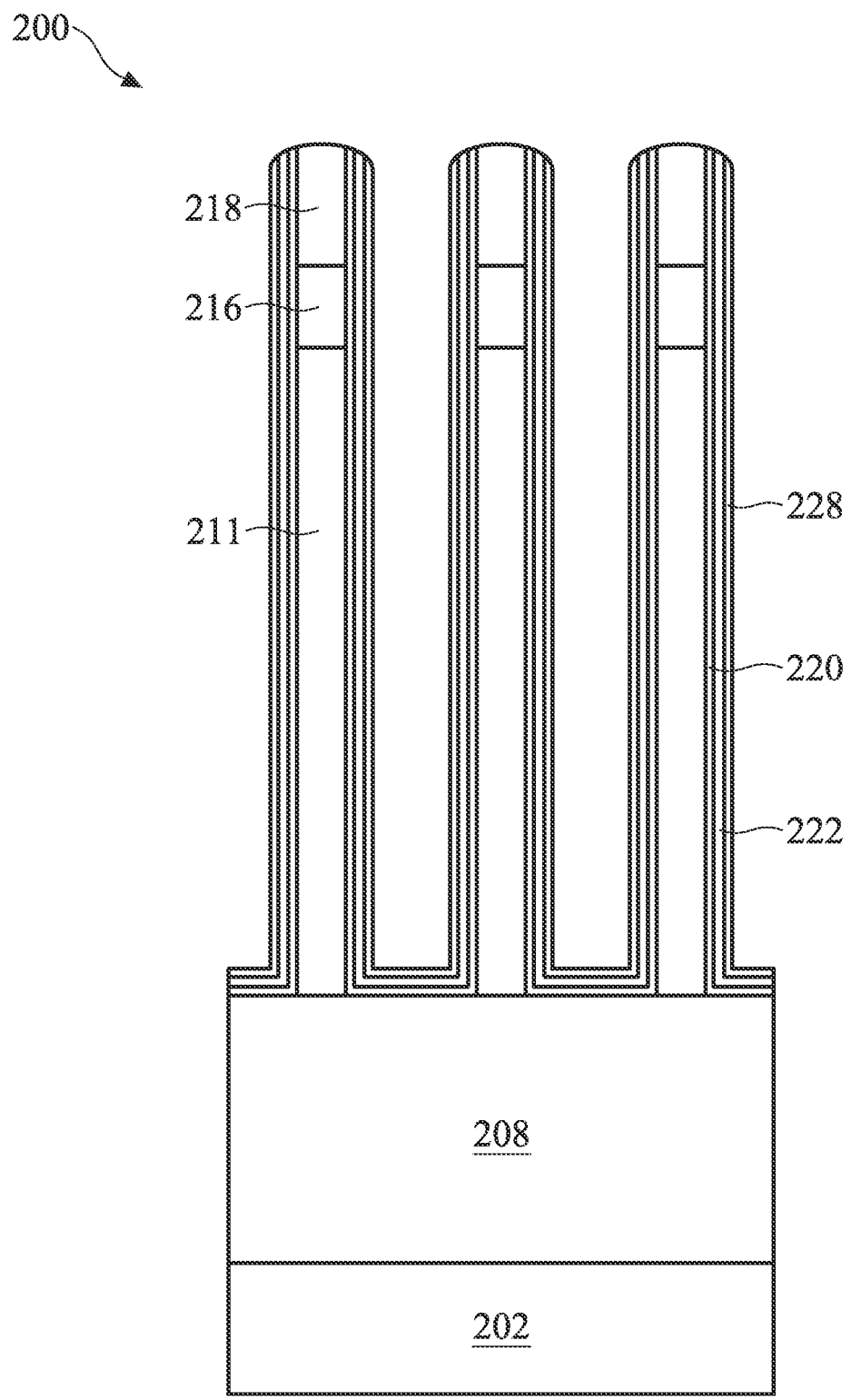
Figure 4B:
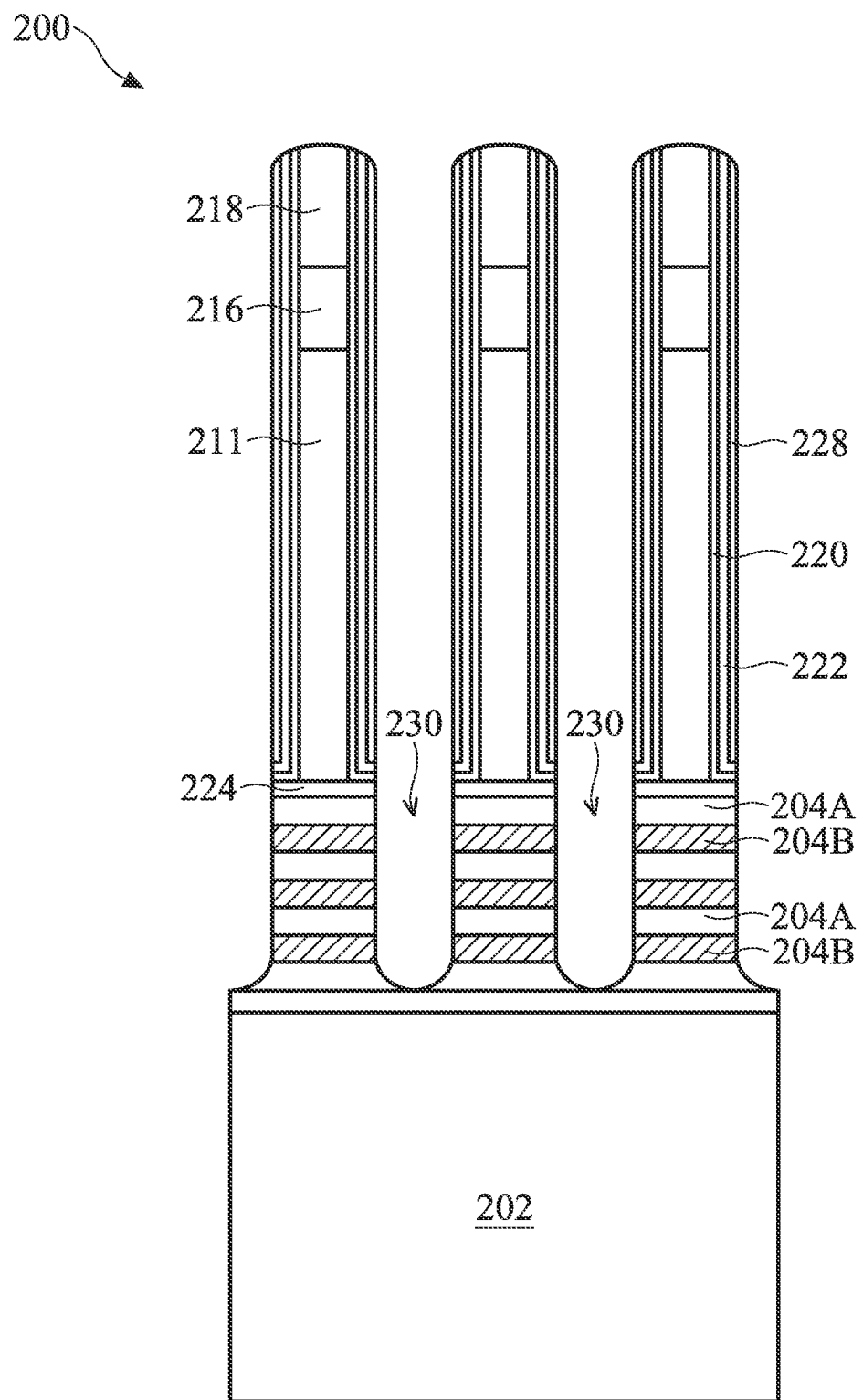
Figure 4C:
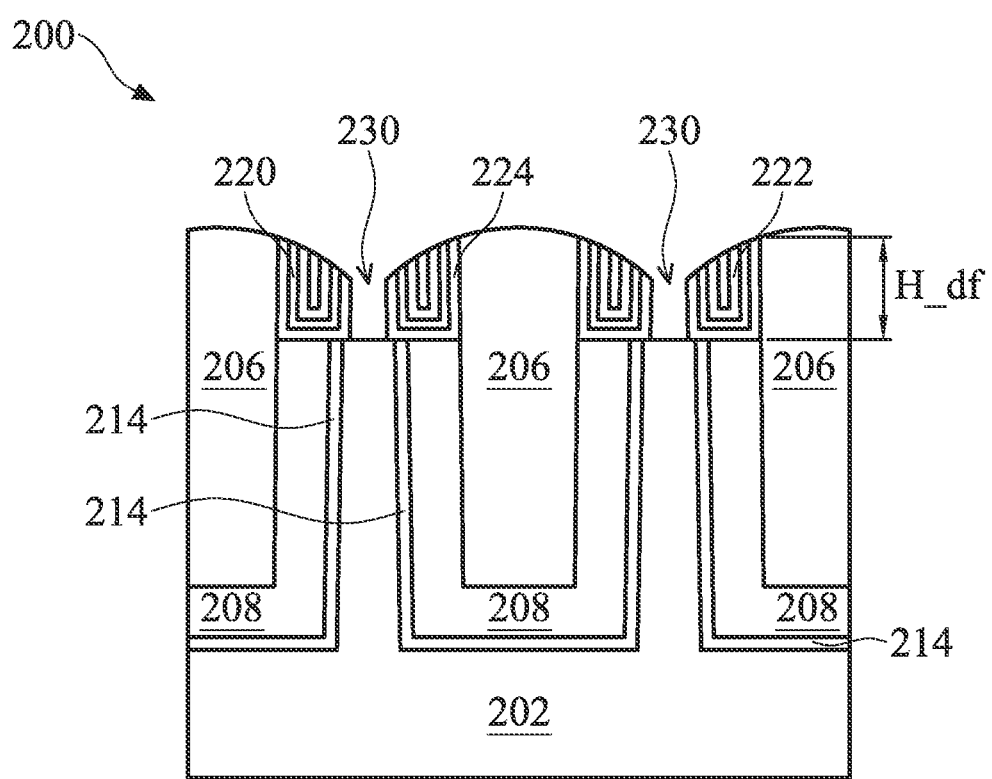

Now referring to FIGS. 1 and 4A-4C, the method 100 at operation 108 forms a liner layer 228 over the device 200. In some embodiments, the liner layer 228 is formed conformally over the device 200, for example, having about the same thickness on top surfaces and sidewalls of the disposable spacer layer 222. Referring to FIG. 4C, in some embodiments, the liner layer 228 fills up the space formed over the disposable spacer layer 222. The liner layer 228 is deposited by any suitable method, such as ALD, to any suitable thickness. The liner layer 228 may include any suitable material, such as silicon nitride, silicon carboxynitride, silicon carboxide, other suitable dielectric materials, or combinations thereof.

Still referring to FIGS. 1 and 4A-4C, the method 100 at operation 110 removes a portion of the semiconductor fins 204 to form recesses 230 therein. In many embodiments, the method 100 forms the recess 230 by a suitable etching process, such as a dry etching process, a wet etching process, or an RIE process. In some embodiments, the method 100 selectively removes the semiconductor fins 204 without etching or substantially etching portions of the layers 220 and 222 formed on sidewalls of the dummy gate stacks 210. As depicted herein, upper portions of the layers 220 and 222 as well as the hard mask layer 218 formed over the dummy gate electrode 211 and an upper portion of the dielectric fins 206 may be removed at operation 110 to form the recess 230. The etching process at operation 110 may implement a dry etching process using an etchant including a bromine-containing gas (e.g., HBr and/or $CHBR_3$), a fluorine-containing gas (e.g., $CF_4$, $SF_6$, $CH_2F_2$, $CHF_3$, and/or $C_2F_6$), other suitable gases, or combinations thereof. The extent of which the semiconductor fins 204 is removed may be controlled by adjusting the duration of the etching process. In some embodiments, the etching process at operation 110 removes upper portions of the dielectric fins 206 such that a remaining height of the dielectric fins 206 (denoted as H_df) is equal to or less than about 30 nm.

Referring to FIGS. 1 and 5A-5C, the method 100 goes through various operations. First, at operation 112 the method 100 selectively removes portions of the semiconductor material 204B by a suitable etching process to form gaps between layers of the semiconductor material 204A, such that portions of the semiconductor material 204A suspend in space. As discussed above, the semiconductor material 204A includes Si and the semiconductor material 204B includes SiGe. Accordingly, the etching process at operation 112 selectively removes potions of SiGe without removing or substantially remove Si. In some embodiments, the etching process is an isotropic etching process (e.g., a dry etching process or a wet etching process), and the extent of which the semiconductor material 204B is removed is controlled by duration of the etching process. In an example embodiment, the method 100 selectively removes portions of the semiconductor material 204B by a wet etching process that utilizes HF and/or $NH_4OH$ as an etchant, which initially oxidizes portions of the semiconductor material 204B to form SiGeOx and subsequently removes the SiGeOx.

Still referring to FIGS. 1 and 5A-5C, the method 100 at operation 114 forms inner spacers 240 adjacent the semiconductor material 204B. The formation of the inner spacers 240 involves multiple processes. In an embodiment, a spacer layer is deposited over the device 200. The spacer layer may fill up the space between layers of the semiconductor material 204A. In some embodiments, the spacer layer is deposited by any suitable method, such as ALD, to any suitable thickness. The spacer layer includes any suitable dielectric material, such as silicon nitride, silicon oxide, silicon carboxynitride, silicon oxycarbide, other suitable dielectric materials, or combinations thereof. Thereafter, portions of the spacer layer are removed using an etching process such that only portions of the spacer layer (i.e., inner spacers 240) remain on sidewalls of the semiconductor material 204B. The inner spacers 240 formed on sidewalls of the semiconductor material 204B are configured to facilitate subsequent fabrication steps for forming multi-gate devices. In some examples, the inner spacers 240 are configured to reduce parasitic capacitance of the resulting multi-gate devices. In some embodiments, the etching process for forming the inner spacers 240 is an isotropic etching process, and the extent of which the spacer layer is removed is controlled by duration of the etching process.

Figure 5A:
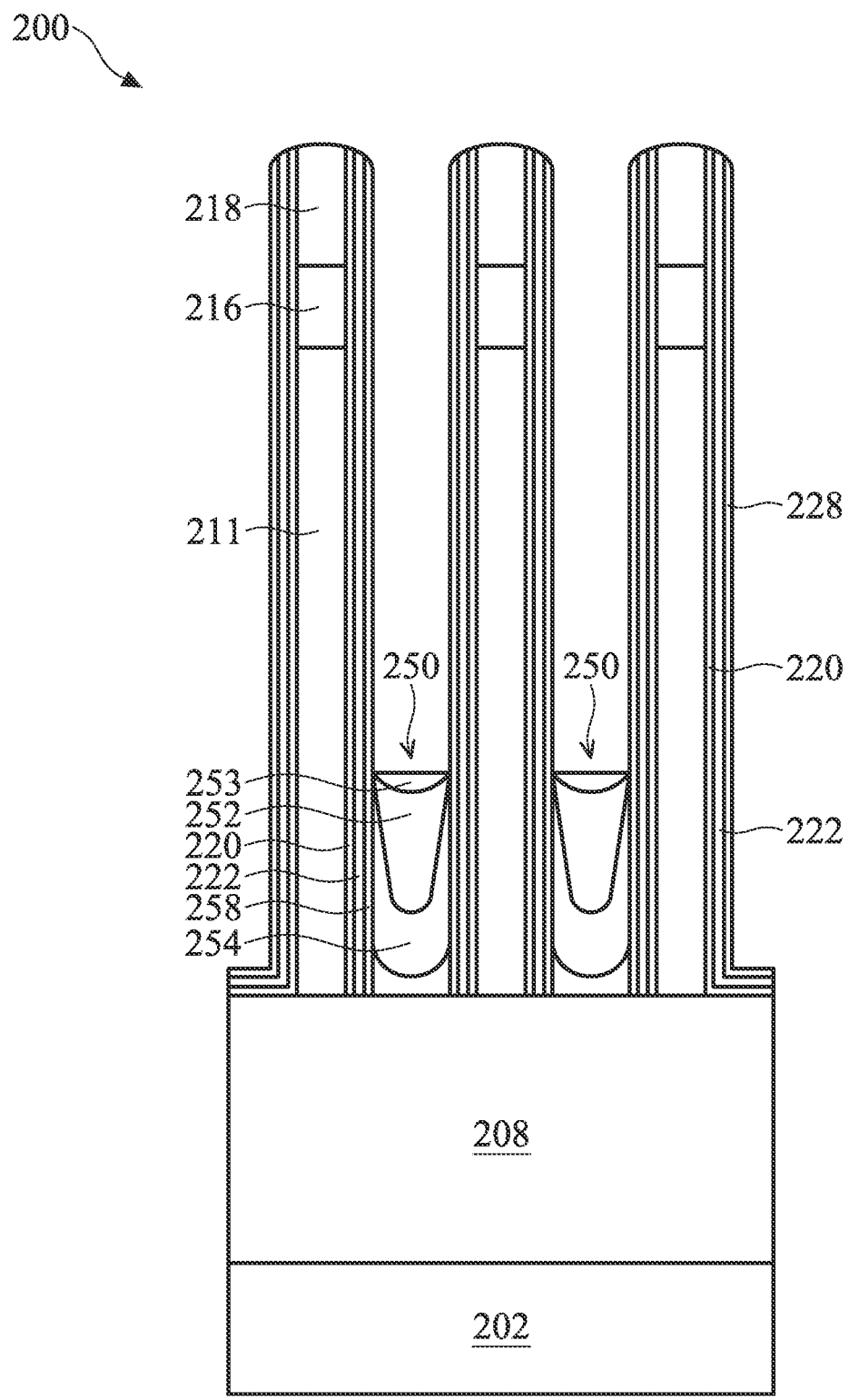
Figure 5B:
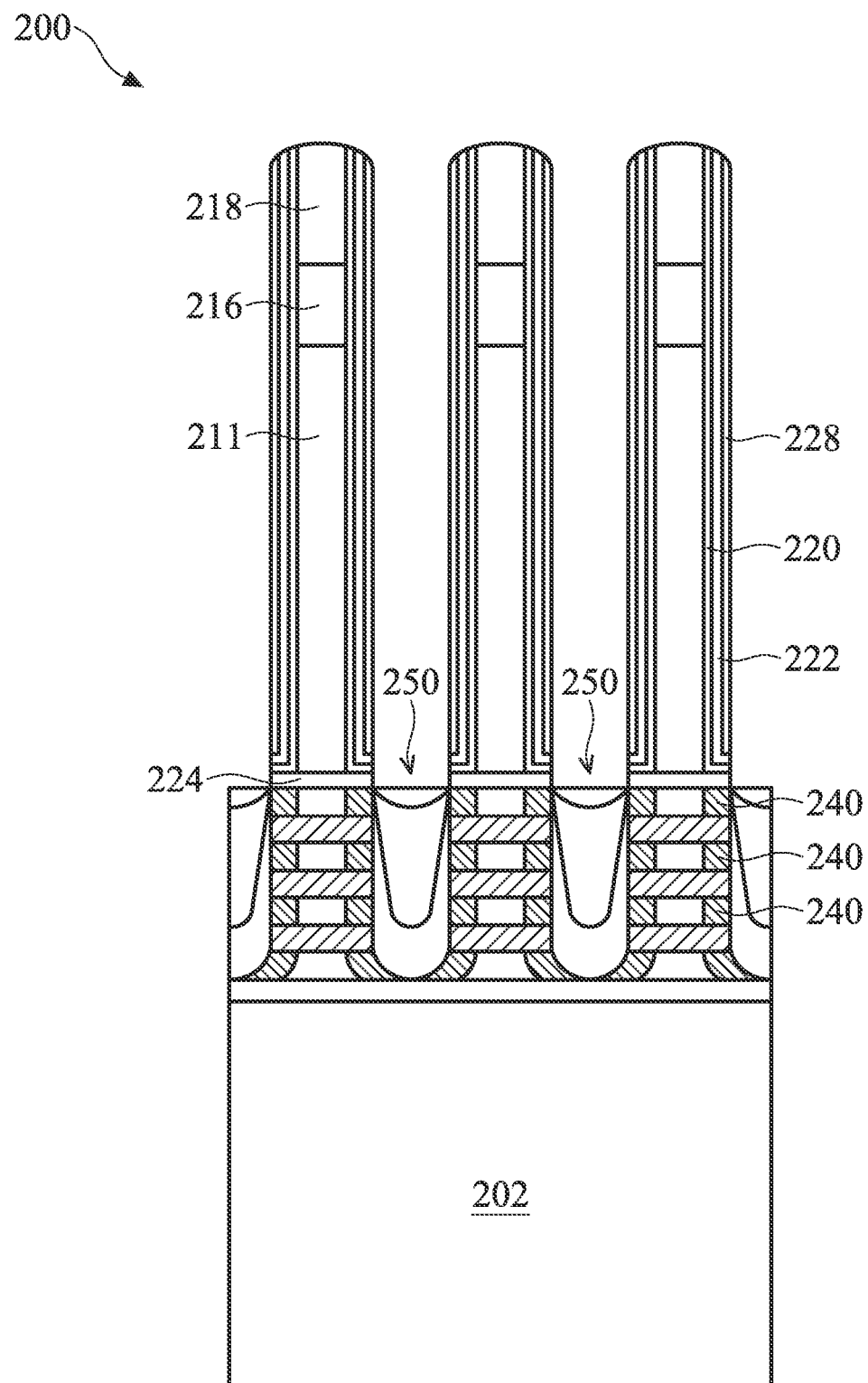
Figure 5C:
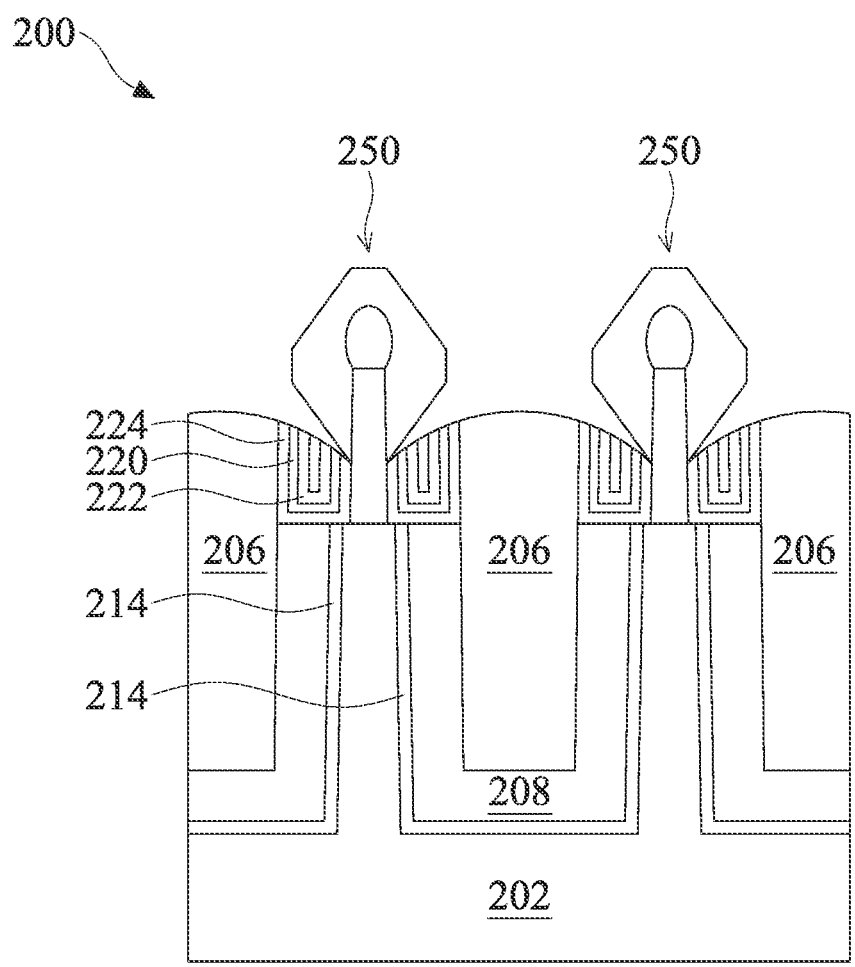
Figure 6A:
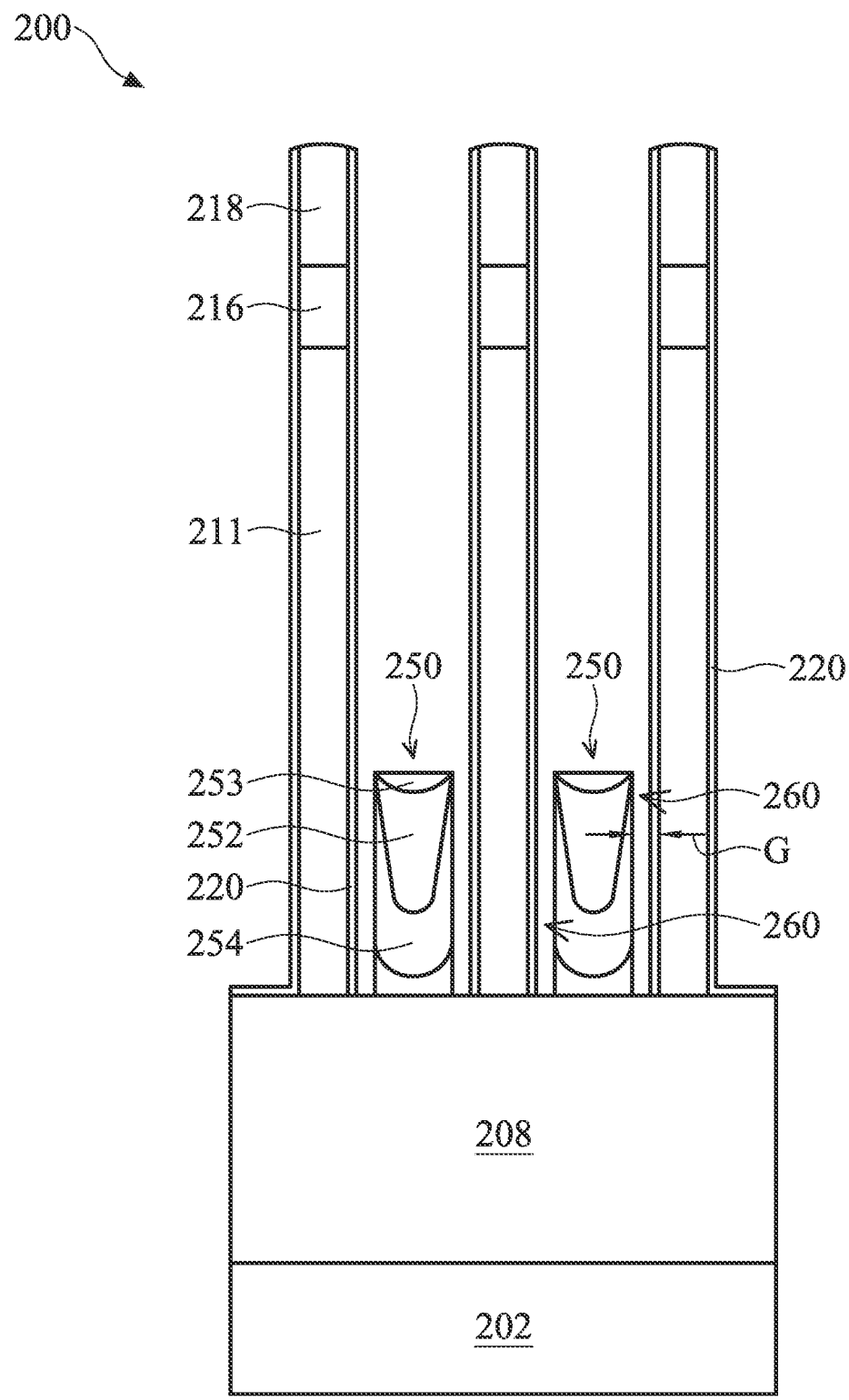
Figure 6B:
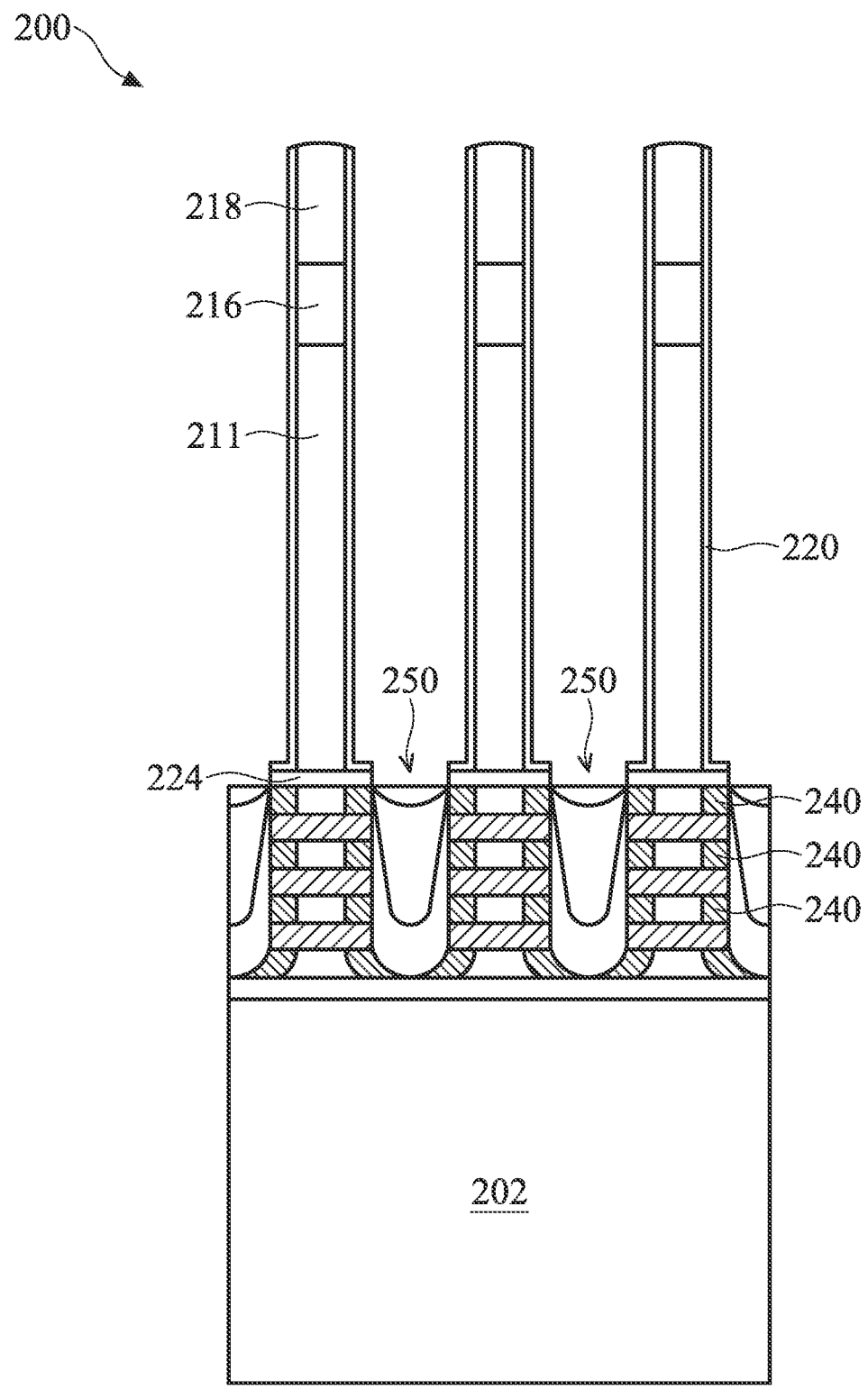
Figure 6C:
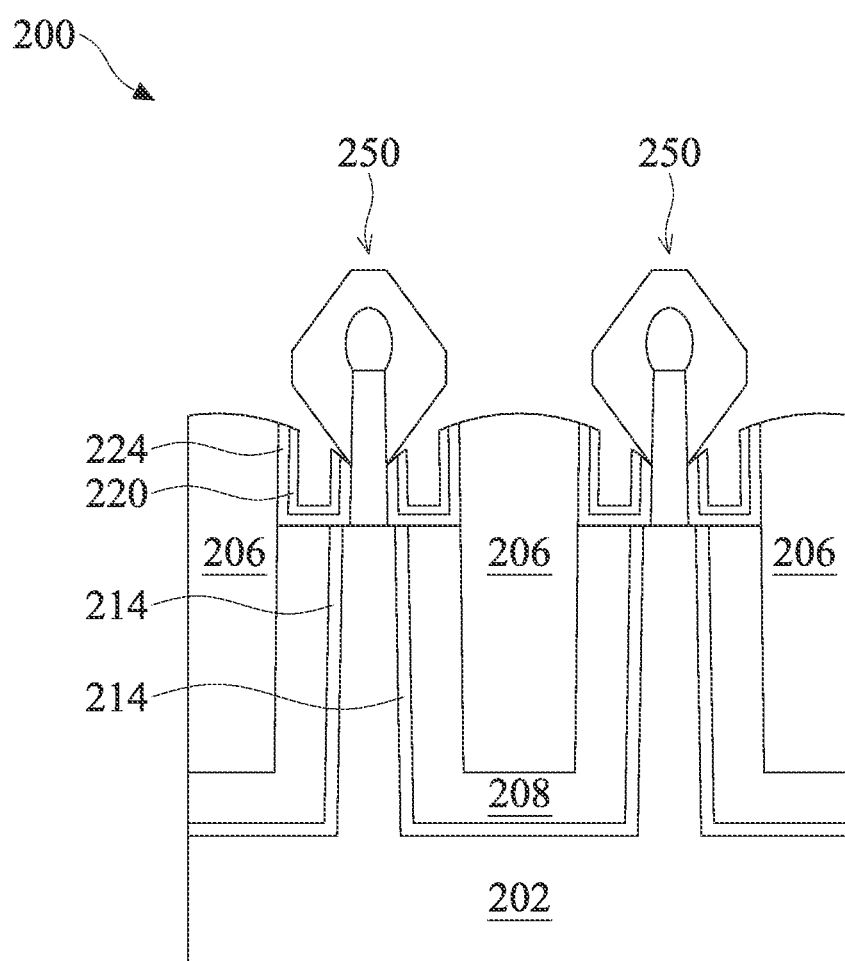

Still referring to FIGS. 1 and 5A-5C, the method 100 at operation 116 grows an epitaxial S/D feature 250 starting from the recess 230. Referring to FIG. 5A, which contains a zoomed-in view of the epitaxial S/D feature 250, the epitaxial S/D feature 250 may include multiple epitaxial semiconductor layers, e.g., layers 252, 253, and 254. In some embodiments, the layers 252, 253, and 254 differ in amount of dopant included therein. In some examples, the amount of dopant included in the layer 252 is less than that included in the layer 254 due to the nature of the doping process. In some examples, the amount of dopant included in the layer 252 is also less than that included in the layer 254 to minimize potential leak currents. In some examples, the amount of dopant included in the layer 253 is about the same or higher than that included in the layer 252. Referring to FIG. 5C, the epitaxial S/D feature 250 initially grows in the recess 230 and then extends above the dielectric fins 206. In other words, the growth of the epitaxial S/D feature 250 is not laterally confined by the width of the recess 230, which allows the size of the epitaxial S/D feature 250 to be flexibly designed.

The epitaxial S/D feature 250 (i.e., the layers 252, 253, and 254 included therein) may be formed by any suitable method, such as MBE, MOCVD, other suitable epitaxial growth processes, or combinations thereof. The epitaxial S/D feature 250 may be suitable for a p-type FinFET device (e.g., a p-type epitaxial material) or alternatively, an n-type FinFET device (e.g., an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopants.

Referring to FIGS. 1 and 6A-6C, the method 100 at operation 118 performs one or more selective etching processes to remove the disposable spacer layer 222 and the liner layer 228. The etching is used to form openings 260 adjacent to the epitaxial S/D feature 250. In many embodiments, the etching process removes the disposable spacer layer 222 and the liner layer 228 disposed between the epitaxial S/D features 250 and the dielectric layer 220. The etching process(es) may implement any suitable etchant configured to remove the disposable spacer layer 222 and the liner layer 228 without removing or substantially removing the epitaxial S/D features 250 and the dielectric layer 220. In some examples, the etching process may be an isotropic etching process (e.g., an isotropic dry etching or an isotropic wet etching process) that implements an etchant that includes hydrofluoric acid (HF), ammonia ($NH_3$), nitrogen trifluoride ($NF_3$), other suitable etchants, or combinations thereof. Each opening 260 is configured to have a well-defined width determined by the total thickness of the disposable spacer layer 222 and the liner layer 228. Accordingly, when selectively removed at operation 118, the width of the opening 260 may thus be uniform or substantially uniform. In many embodiments, as discussed below, the opening 260 is configured to accommodate the formation of a silicide layer that fully wraps the epitaxial S/D feature 250.

Figure 7A:
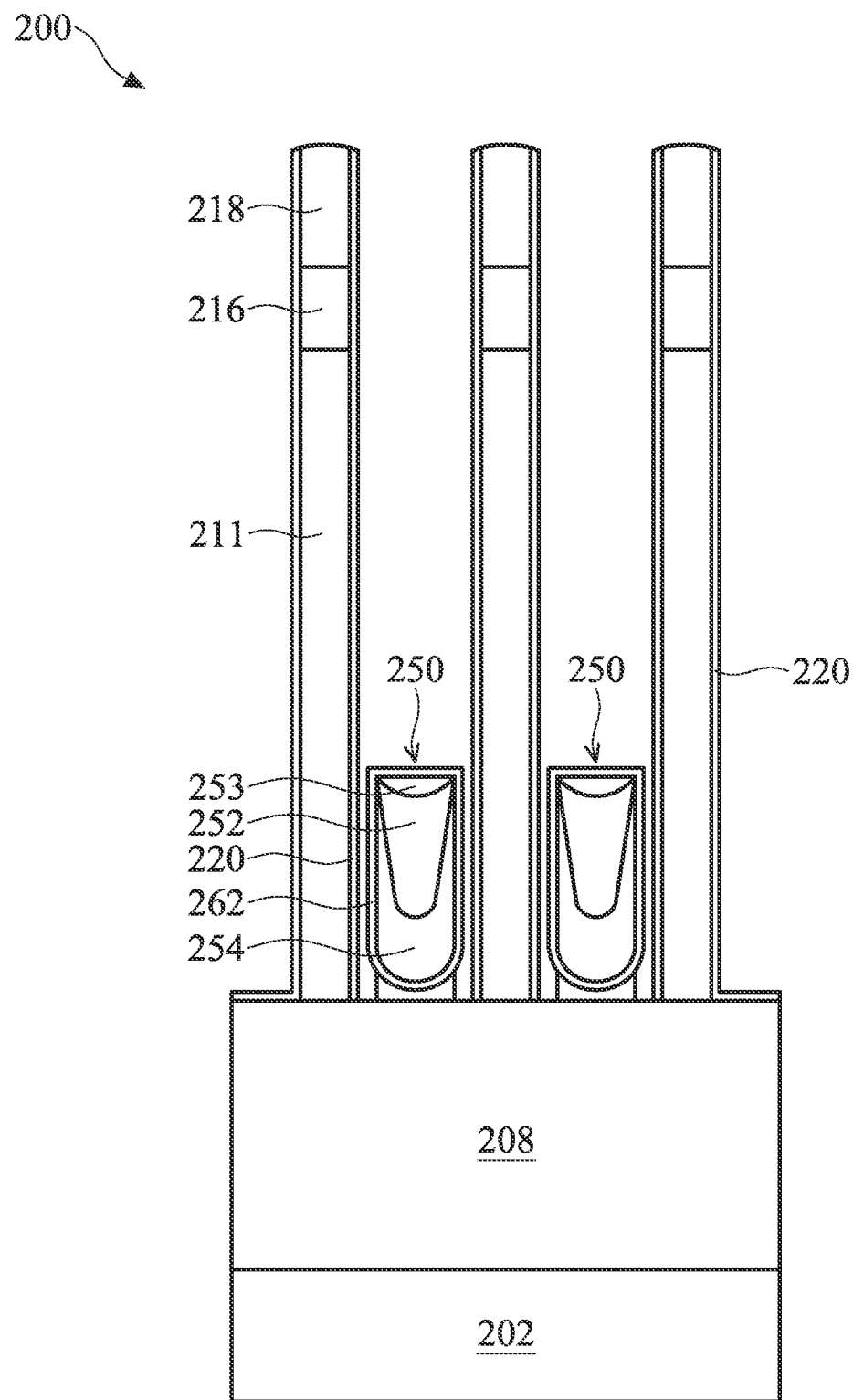
Figure 7B:
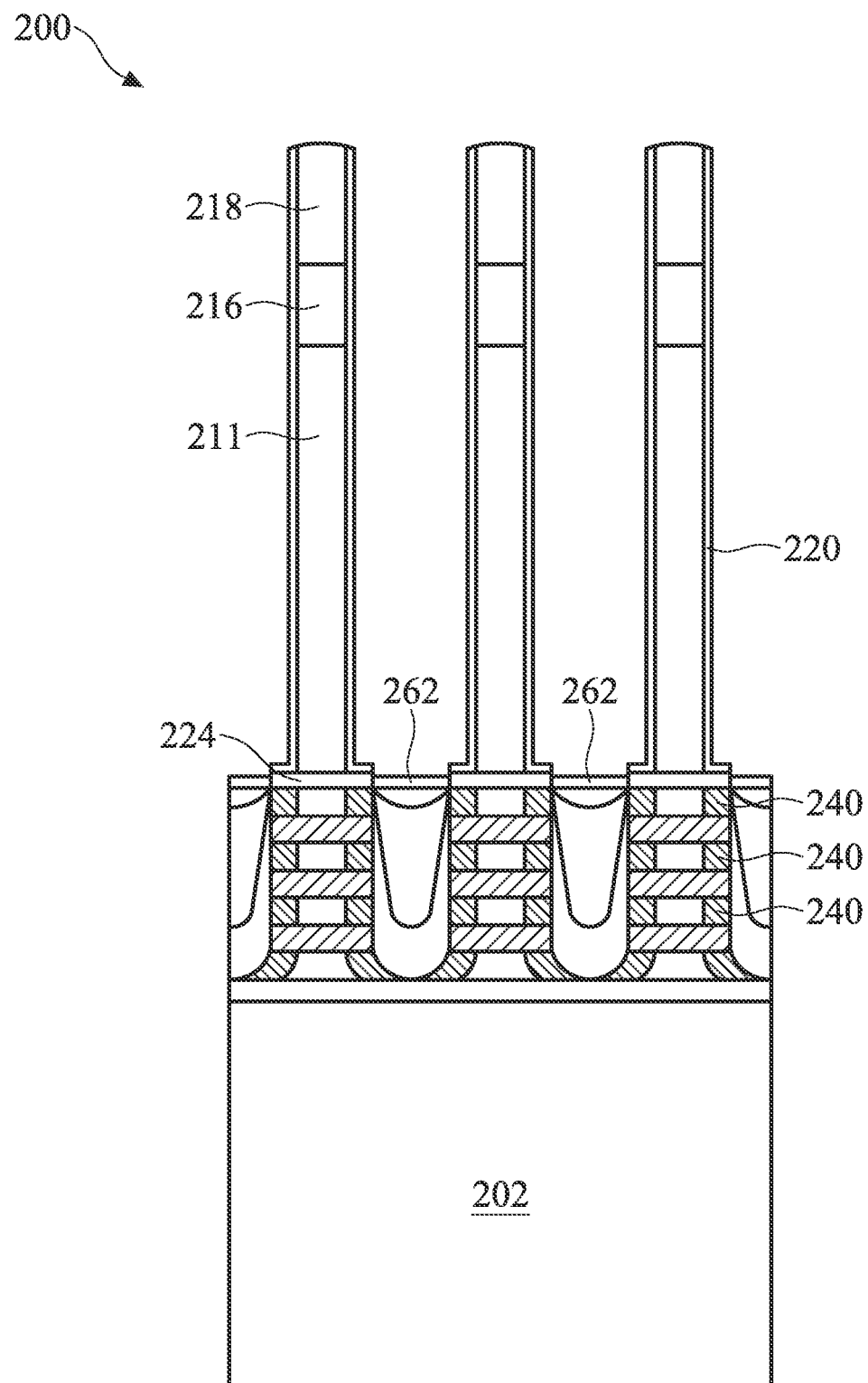
Figure 7C:
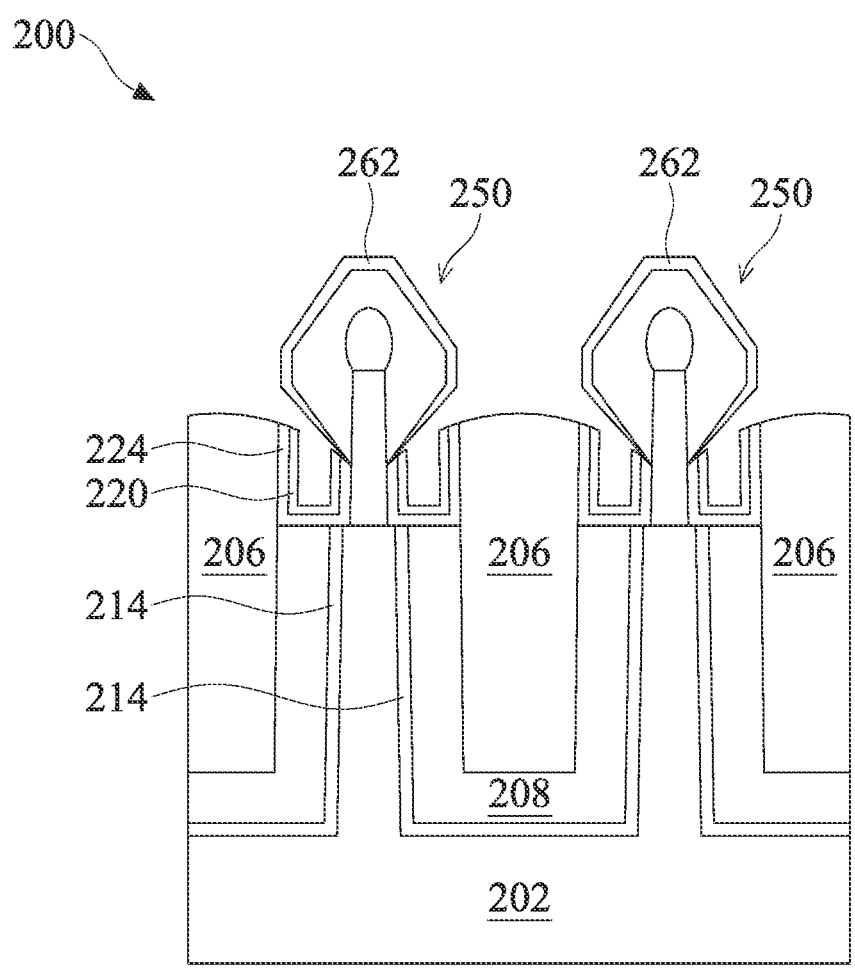

Referring to FIGS. 1 and 7A-7C, the method 100 at operation 120 forms a (selective) dummy epitaxial cap layer 262 over the epitaxial S/D features 250 in the openings 260, such that the dummy epitaxial cap layer 262 wraps around the epitaxial S/D features 250. The dummy epitaxial cap layer 262 includes silicon, germanium, other suitable materials, or combinations thereof. The dummy epitaxial cap layer 262 is formed by any suitable method such as CVD, ALD, PVD, other suitable processes, or combinations thereof. As shown in FIG. 7A, the dummy epitaxial cap layer 262 partially fills the opening 260 at operation 120. In some examples, the dummy epitaxial cap layer 262 may be formed to have a thickness of about 2 nm to about 3 nm, which may range from about 20% to about 50% of a gap distance between an epitaxial S/D feature 250 and its adjacent dielectric layer 220 (denoted as G in FIG. 7A). As such, an air gap remains between dummy epitaxial cap layer 262 and its adjacent dielectric layer 220 after operation 120.

Notably, because operation 120 is implemented after recessing the disposable spacer layer 222 and the liner layer 228 but before forming an S/D contact, the opening 260 provides space for the dummy epitaxial cap layer 262 to be formed on exposed surfaces of the epitaxial S/D feature 250, such that the dummy epitaxial cap layer 262 fully wraps around the epitaxial S/D feature 250. As illustrated in FIG. 7A, the dummy epitaxial cap layer 262 is formed on top, sidewall, and bottom surfaces of the epitaxial S/D feature 250. As described further below, the dummy epitaxial cap layer 262 is to be replaced by a silicide layer 280 that would also fully wrap around the epitaxial S/D feature 250. Advantageously, embodiments provided herein increase the contact area between the silicide layer 280 and the epitaxial S/D feature 250, thereby reducing the contact resistance between the epitaxial S/D features 250 and S/D contacts formed hereafter.

Figure 8A:
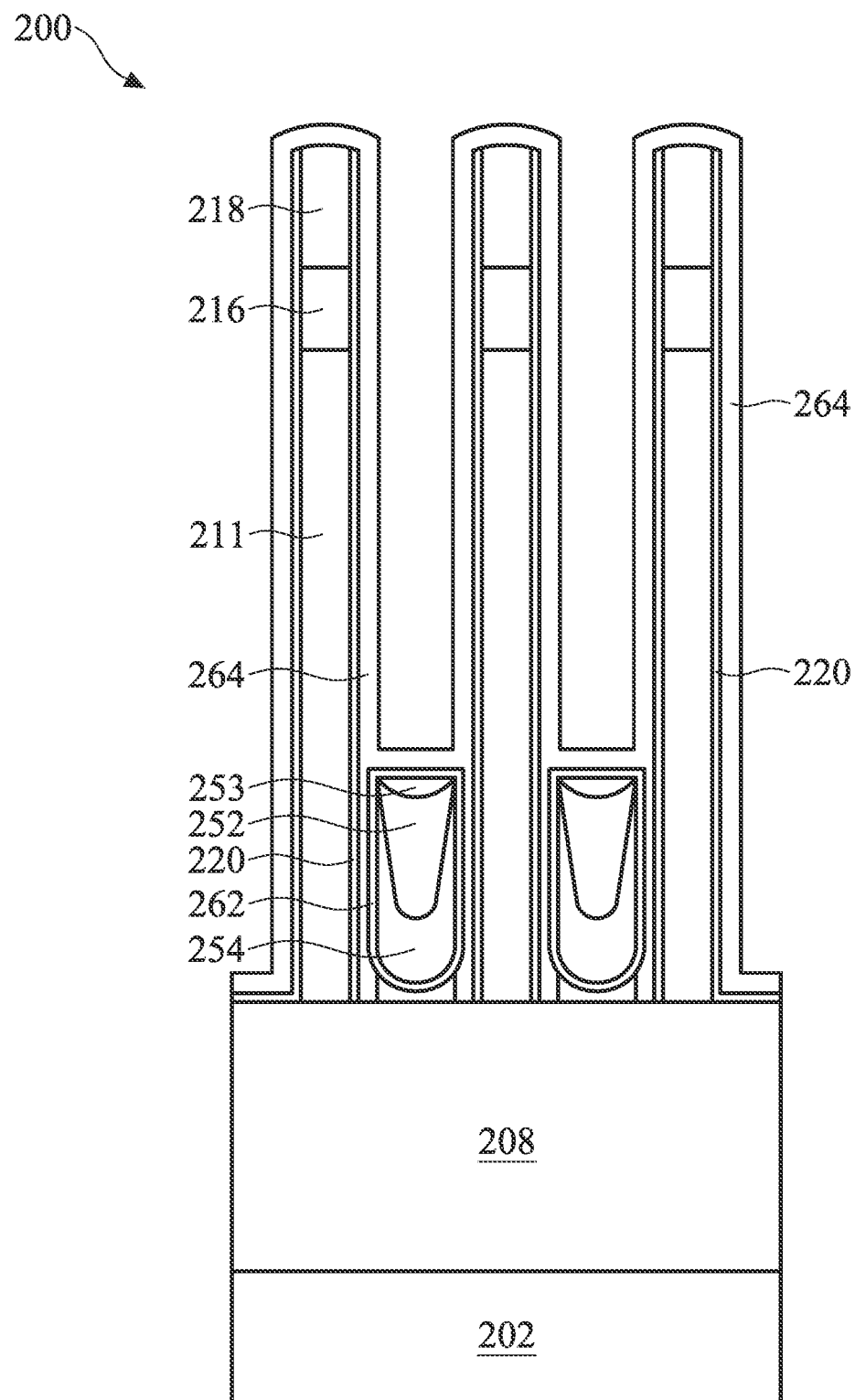
Figure 8B:
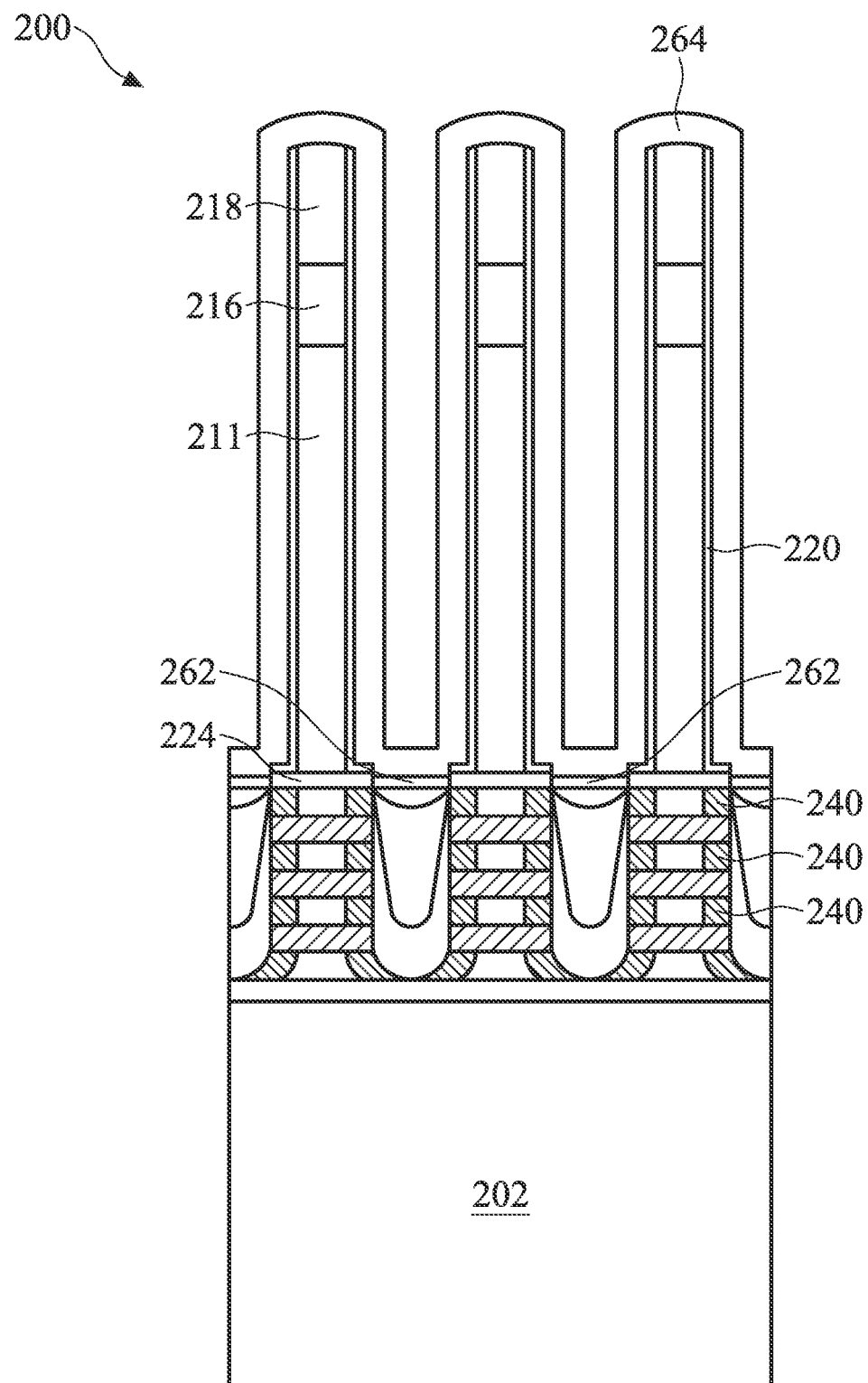
Figure 8C:
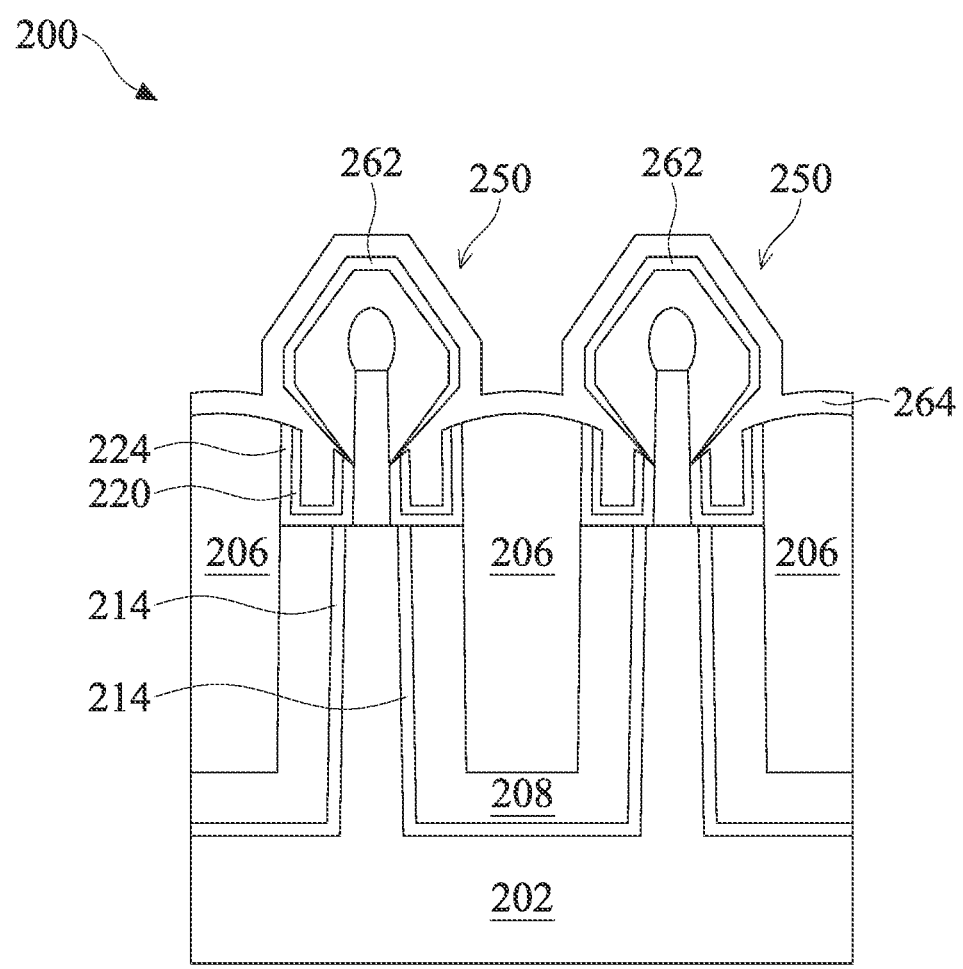

Referring to FIGS. 1 and 8A-8C, the method 100 at operation 122 forms a spacer layer 264 over the device 200. The spacer layer 264 may include any suitable dielectric material, such as a low-k dielectric material, and may be formed by any suitable method, such as ALD, CVD, PVD, other suitable methods, or combinations thereof. As illustrated in FIG. 8A, the spacer layer 264 fills the air gap left between an epitaxial S/D feature 250 and its adjacent dielectric layer 220. As illustrated in FIG. 8C, the spacer layer 264 also fills the opening 260 and covers the epitaxial S/D feature 250 and its adjacent dielectric fins 206. In some embodiments, the spacer layer 264 has a conformal profile on the dummy gate stacks 210 (e.g., having about the same thickness on top and sidewall surfaces of the dummy gate stacks 210). In some examples, the spacer layer 264 is formed to have a thickness of about 3 nm to about 7 nm, which may range from about 50% to about 80% of a gap distance between an epitaxial S/D feature 250 and its adjacent dielectric layer 220 (denoted as G in FIG. 7A). In some examples, the spacer layer 264 may be or include a contact etch-stop layer (CESL), in which case the spacer layer 264 may include silicon nitride, silicon oxynitride, silicon nitride with oxygen or carbon elements, other suitable materials, or combinations thereof, and may be formed by CVD, PVD, ALD, other suitable methods, or combinations thereof.

Referring to FIGS. 1 and 9A-9C, the method 100 includes an operation 123 to form an interlayer dielectric (ILD) layer 266 over the spacer layer 264 in some embodiments. The ILD layer 266 includes a dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. The ILD layer 266 may include a multi-layer structure having multiple dielectric materials and may be formed by a deposition process such as, for example, CVD, flowable CVD (FCVD), spin-on-glass (SOG), other suitable methods, or combinations thereof. In some embodiments, forming the ILD layer 266 further includes performing a CMP process to planarize a top surface of the device 200, such that the top surfaces of the dummy gate stacks 210 are exposed.

Still referring to FIGS. 1 and 9A-9C, the method 100 at operation 124 performs a gate replacement process to replace the dummy gate stacks 210 with respective metal gate structures 270. In some embodiments, each metal gate structure 270 is a high-k metal gate structure (HKMG), where "high-k" indicates that the metal gate structure 270 includes a gate dielectric layer having a dielectric constant greater than that of silicon dioxide (about 3.9). The gate replacement process at operation 124 may be implemented in a series of fabrication steps as described in detail below.

Figure 9A:
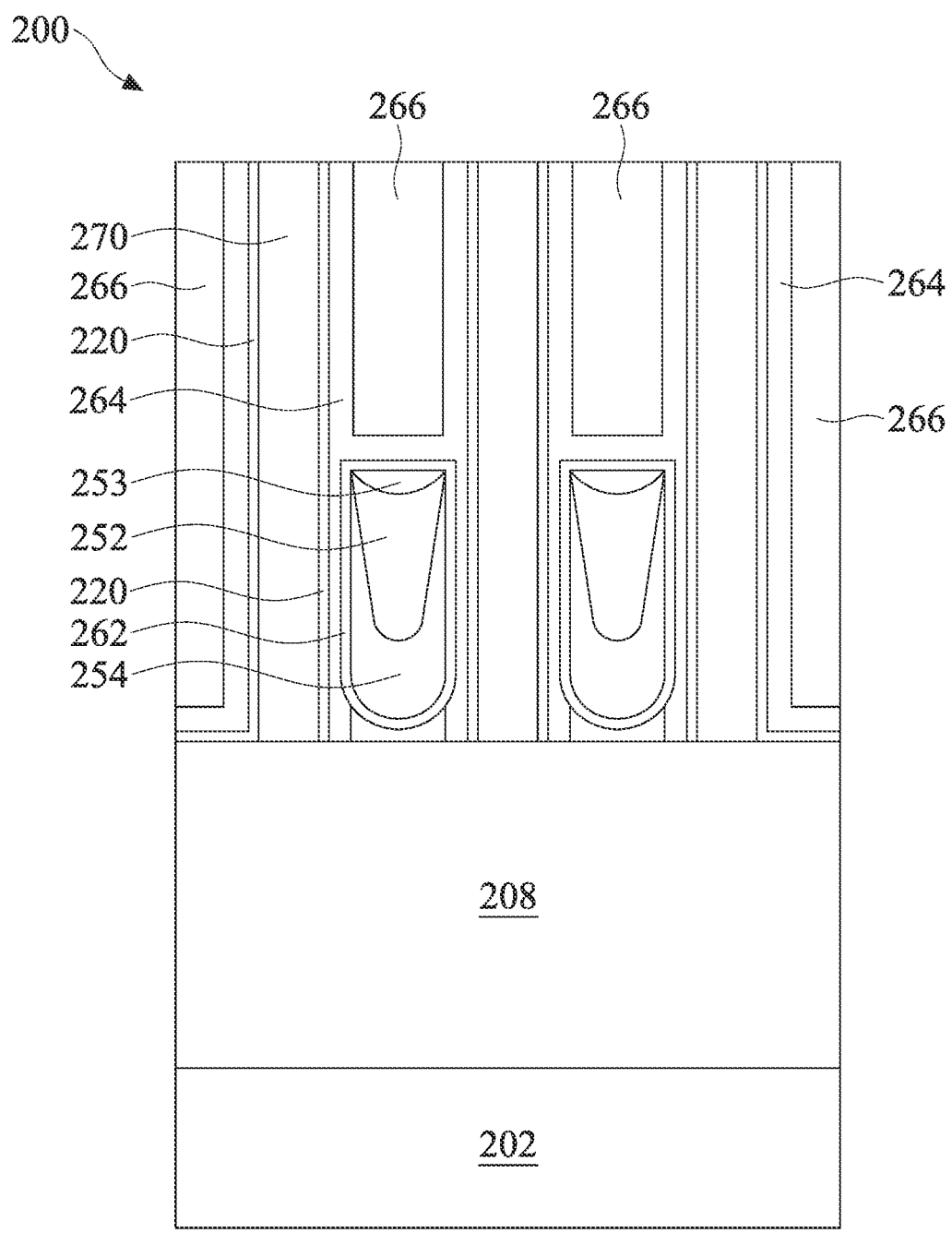
Figure 9B:
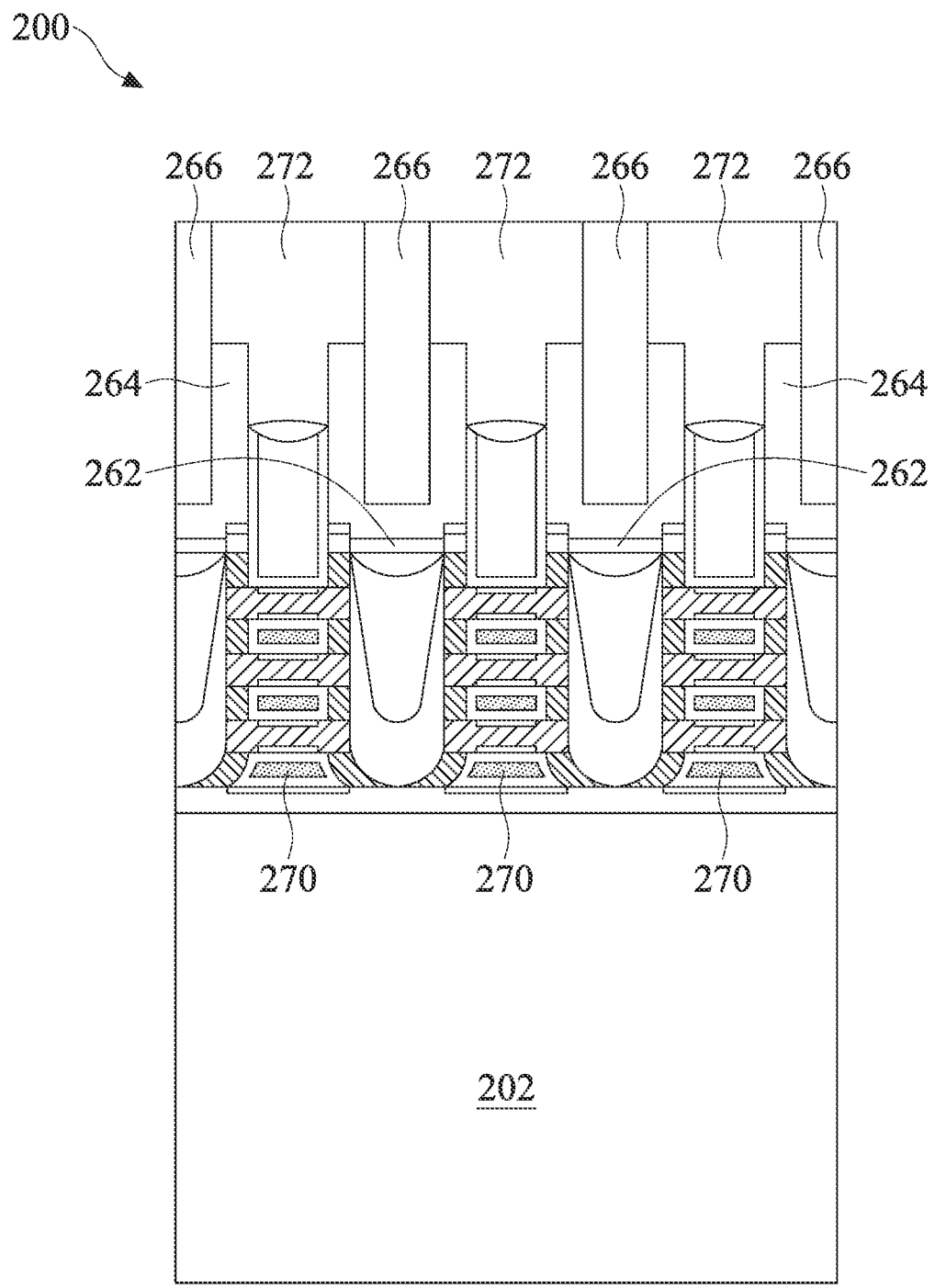
Figure 9C:
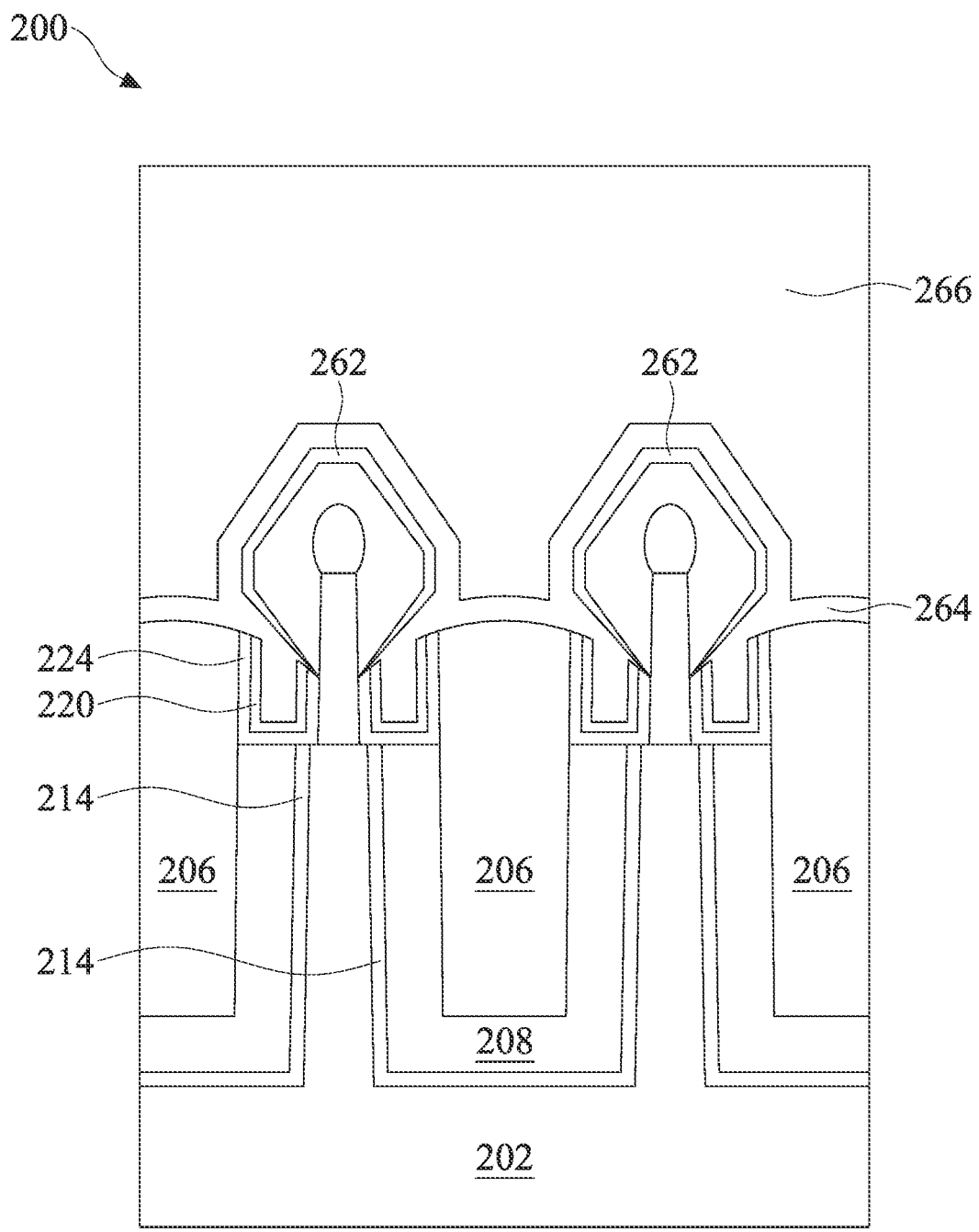

For embodiments in which a multi-gate device (e.g., a GAA FET) is desired, referring to FIG. 9B for example, before forming the spacer layer 264 and/or the ILD layer 266, the semiconductor layers 204B (including SiGe) are selectively removed from the semiconductor fins 204 in an etching process, such that voids or gaps (not depicted) are formed between stacks of the semiconductor layers 204A (including Si). In some embodiments, the etching process may be a dry etching process or a wet etching process. Thereafter, the method 100 at operation 124 removes the dummy gate stacks 210 by any suitable method to form a gate trench (not depicted) over the semiconductor fins 204. Forming the gate trench may include one or more etching processes that are selective to the materials included in the dummy gate stacks 210 (e.g., polysilicon included in the dummy gate electrodes 211). The etching processes may include dry etching, wet etching, RIE, or other suitable etching methods, or combinations thereof.

Then, the method 100 proceeds to forming the metal gate structure 270 in the gate trench. For embodiments in which the semiconductor fin 204 includes alternating stacks of the semiconductor materials 204A and 204B, various material layers of the metal gate structure 270 are also deposited in the gaps formed between the layers of the semiconductor material 204A when the semiconductor material 204B is removed from the device 200. Though not depicted, the metal gate structure 270 may include multiple material layers, such as a high-k gate dielectric layer formed over the interfacial layer 224, a work function metal layer formed over the high-k gate dielectric layer, a bulk conductive layer formed over the work function metal layer, other suitable layers, or combinations thereof. The high-k dielectric layer may include one or more high-k dielectric materials (or one or more layers of high-k dielectric materials), such as hafnium silicon oxide (HfSiO), hafnium oxide (HfO$_2$), alumina (Al$_2$O$_3$), zirconium oxide (ZrO$_2$), lanthanum oxide (La$_2$O$_3$), titanium oxide (TiO$_2$), yttrium oxide (Y$_2$O$_3$), strontium titanate (SrTiO$_3$), or a combination thereof. The work function metal layer may include any suitable material, such as titanium nitride (TiN), tantalum nitride (TaN), ruthenium (Ru), molybdenum (Mo), tungsten (W), platinum (Pt), titanium (Ti), aluminum (Al), tantalum carbide (TaC), tantalum carbide nitride (TaCN), tantalum silicon nitride (TaSiN), titanium silicon nitride (TiSiN), other suitable materials, or combinations thereof. In some embodiments, the work function metal layer includes multiple material layers of the same or different types (i.e., both n-type work function metal or both p-type work function metal) in order to achieve a desired threshold voltage. The bulk conductive layer may include aluminum (Al), copper (Cu), tungsten (W), cobalt (Co), ruthenium (Ru), other suitable conductive materials, or combinations thereof. The metal gate structure 270 may include other material layers, such as a barrier layer, a glue layer, a hard mask layer 272 (shown in FIG. 9B), and/or a capping layer. The various layers of the metal gate structure 270 may be formed by any suitable method, such as CVD, ALD, PVD, plating, chemical oxidation, thermal oxidation, other suitable methods, or combinations thereof. Thereafter, the method 100 may perform one or more polishing process (e.g., CMP) to remove any excess conductive materials and planarize the top surface of the device 200.

Referring to FIGS. 1 and 10A-10C, the method 100 also includes an operation 125 by performing a patterning process to form contact holes 265 in the ILD layer 266. The contact holes 265 are aligned with the S/D features 250. The formation of the contact holes 265 includes forming a patterned resist layer by a lithography process with openings that define regions for contact holes 265; etching the ILD layer 266 through the openings of the patterned resist layer; and removing the patterned resist layer by wet stripping or plasma ashing. A hard mask may be additionally employed to patterning the contact holes 265.

Figure 10A:
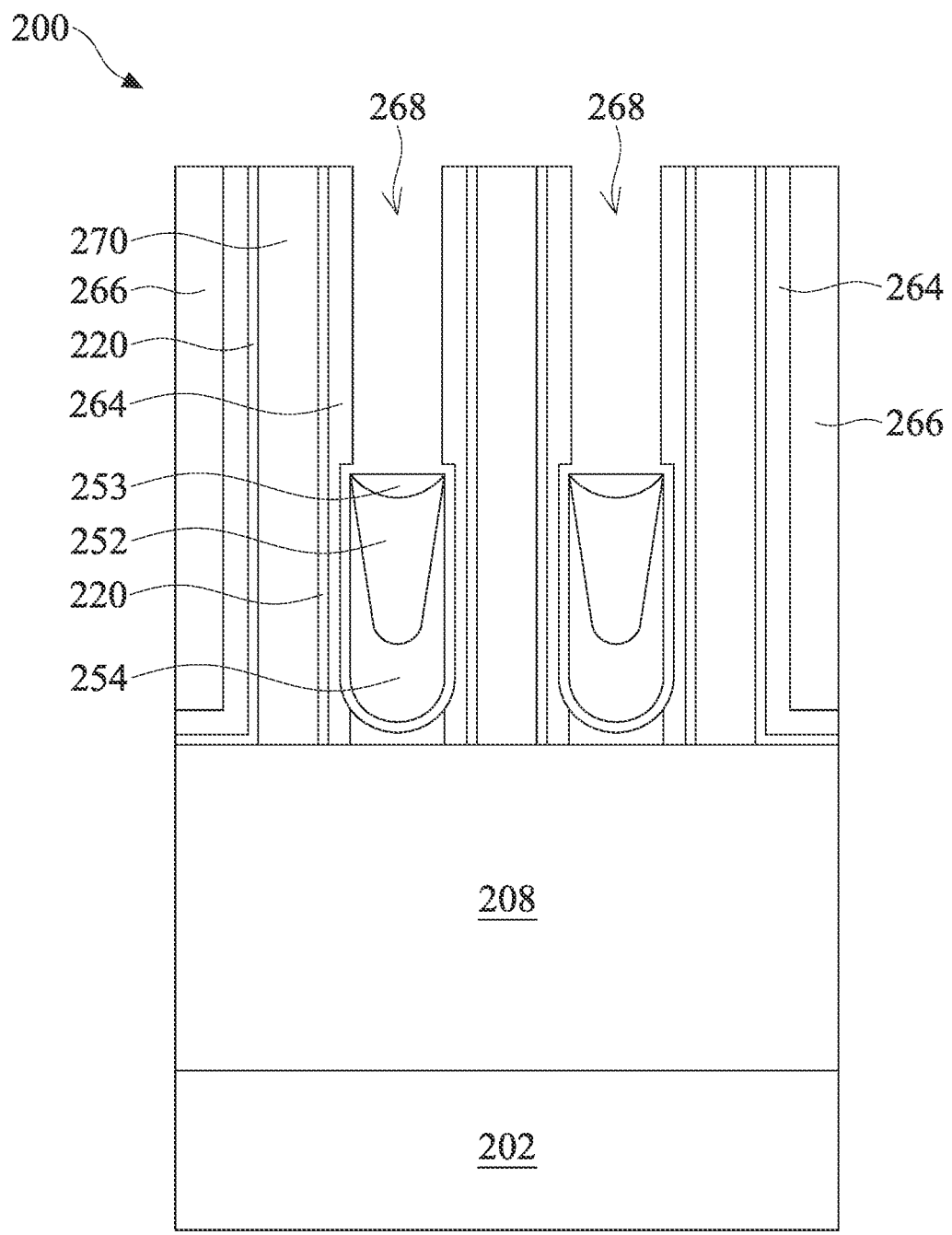
Figure 10B:
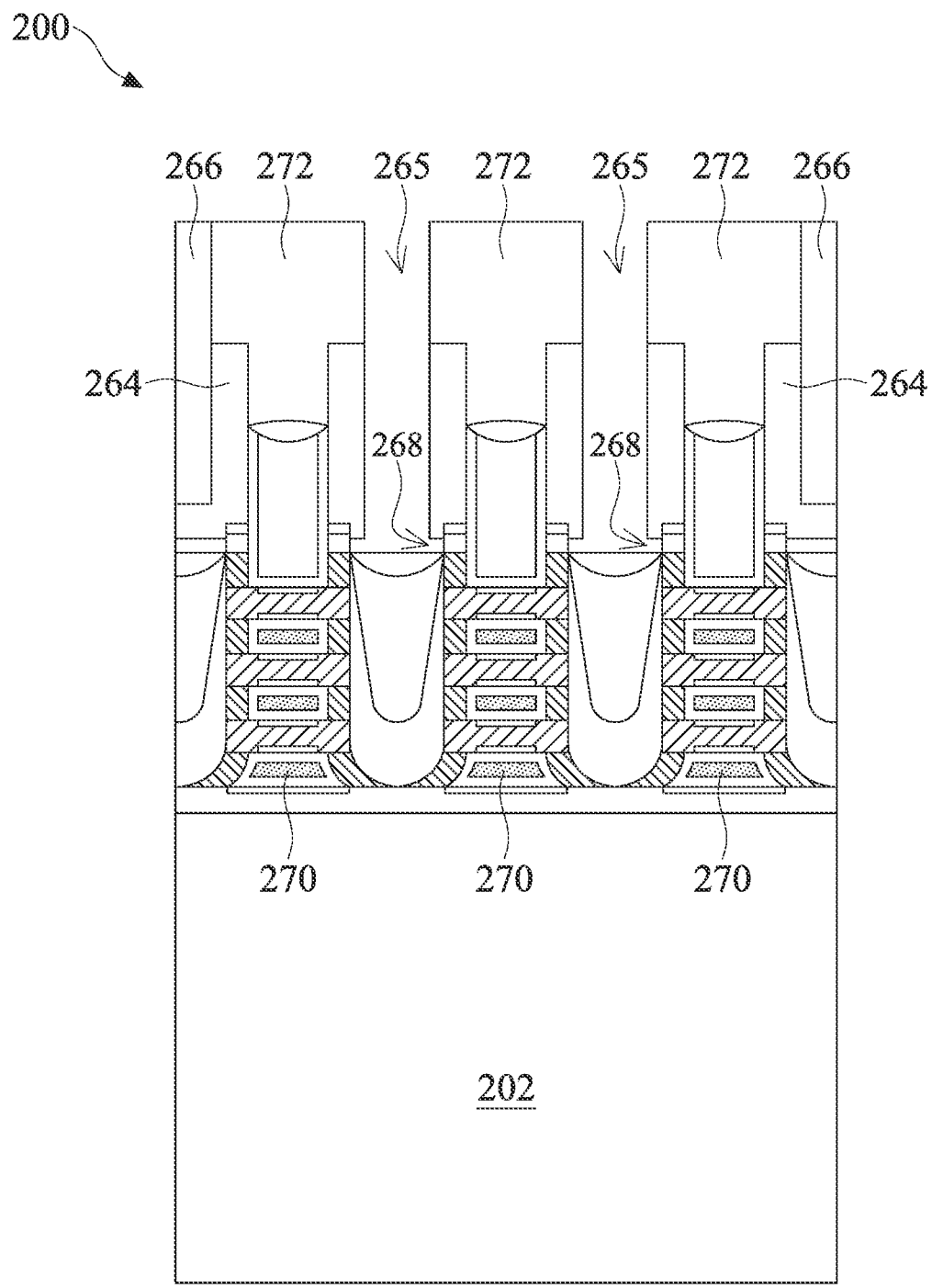
Figure 10C:
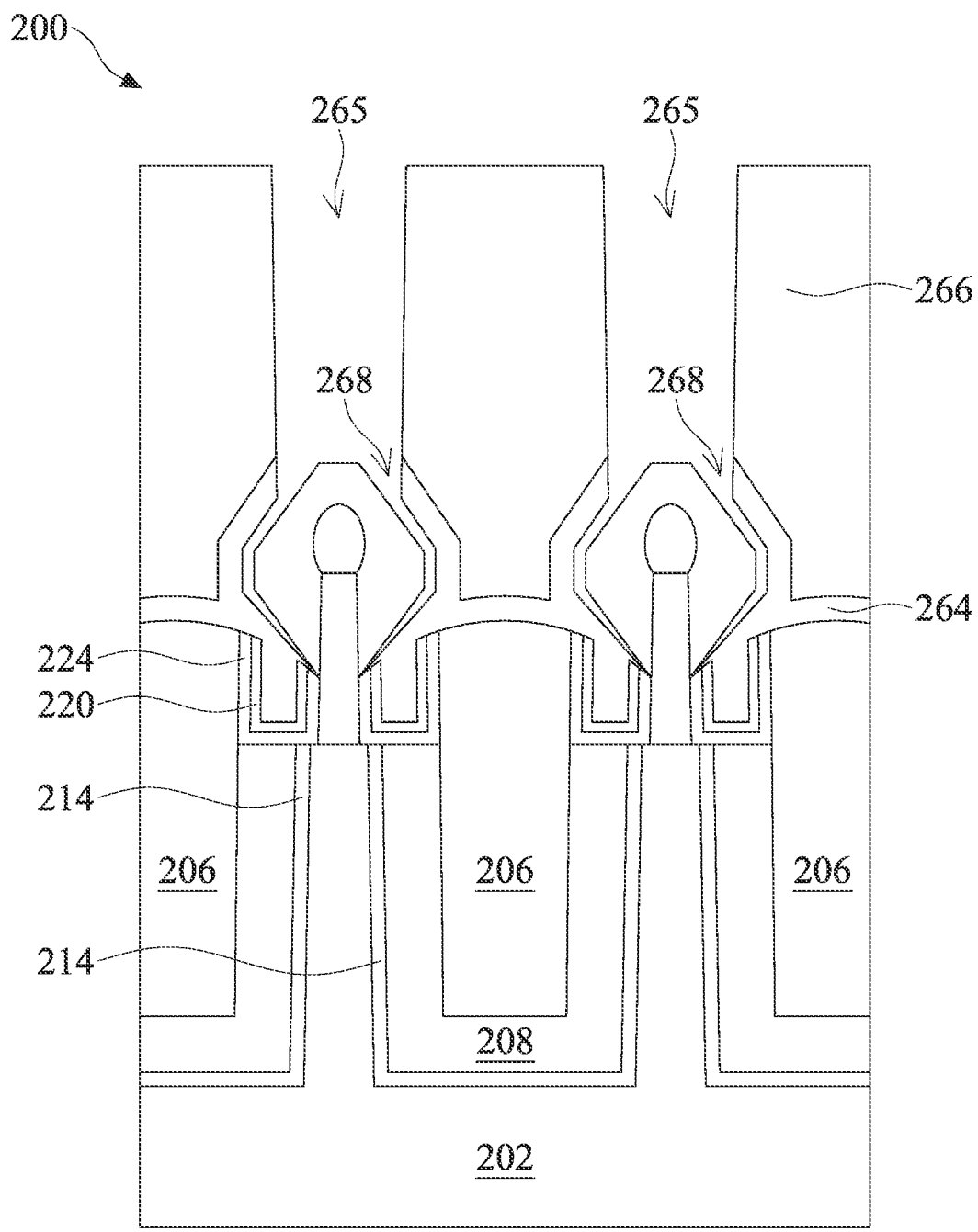
Figure 11A:
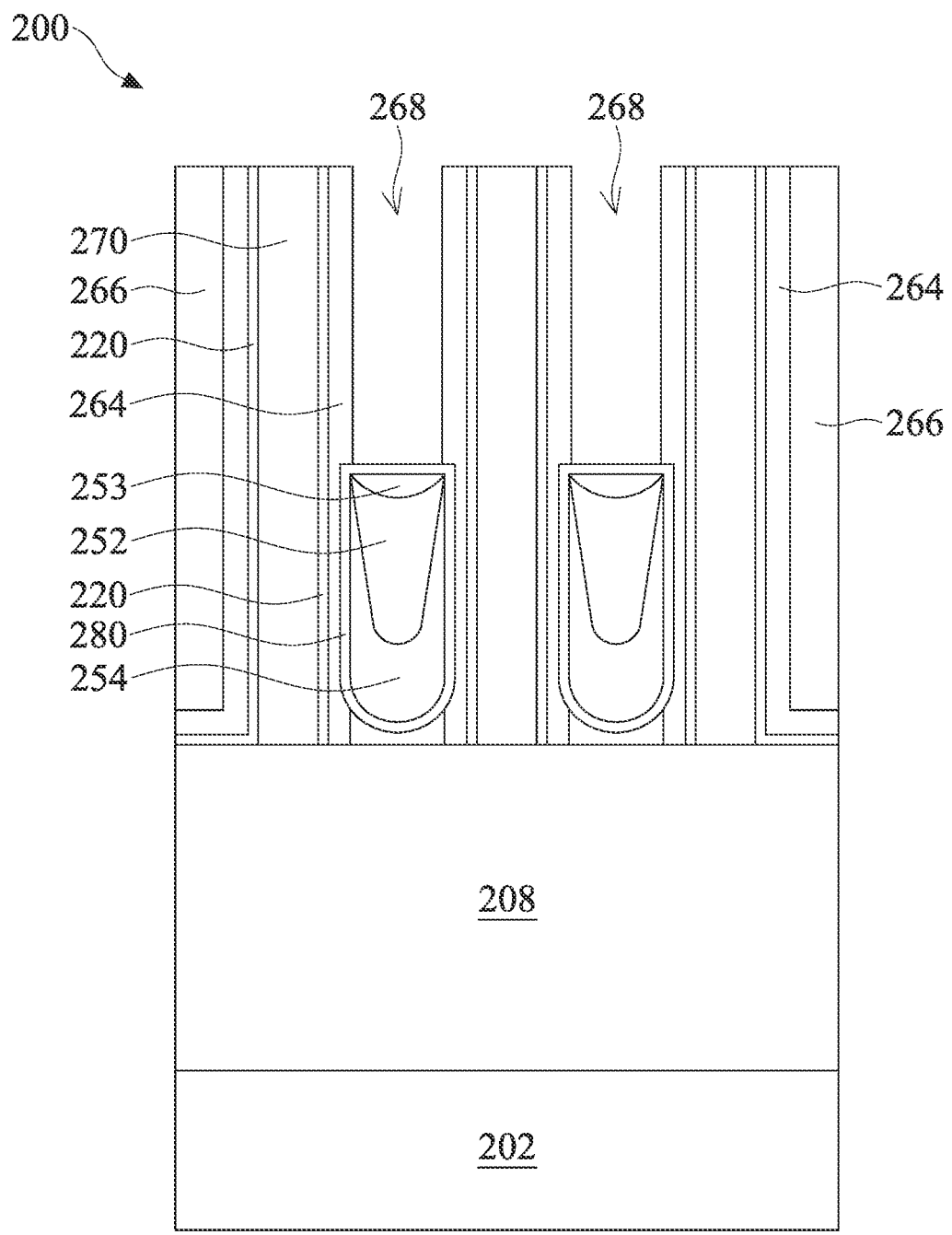

Still referring to FIGS. 1 and 10A-10C, the method 100 at operation 126 performs one or more selective etching processes to remove the previously-formed dummy epitaxial cap layer 262 from the device 200. As illustrated in FIG. 10A, the etching creates air gaps 268 between the epitaxial S/D features 250 and respective portions of the spacer layer 264. The etching process(es) may implement any suitable etchant configured to remove the dummy epitaxial cap layer 262 without removing or substantially removing the epitaxial S/D features 250 and the spacer layer 264. The epitaxial S/D 250 is ended with a lower Ge % (<20%) compared with the dummy epitaxial cap layer 262, which serves as an etching stop layer during dummy cap layer 162 removal. In some examples, the etching process may be an isotropic etching process (e.g., an isotropic dry etching or an isotropic wet etching process) that implements an etchant that includes hydrofluoric acid (HF), ammonia (NH$_3$), nitrogen trifluoride (NF$_3$), other suitable etchants, or combinations thereof. As shown in FIG. 10B, in certain portions of the device 200 (e.g., portions directly above the epitaxial S/D features 250), additional etching step(s) is performed to remove the ILD layer 266 before the dummy epitaxial cap layer 262 can be exposed. Note that the air gap 268 is configured to have a well-defined width determined by the thickness of the dummy epitaxial cap layer 262 (and indirectly determined by the total thickness of the disposable spacer layer 222 and the liner layer 228). Accordingly, when selectively removed at operation 126, the air gaps 268 may have uniform or substantially uniform width. As discussed below, the air gaps 268 are configured to accommodate the formation of a silicide layer that fully wraps the epitaxial S/D features 250. Referring to FIGS. 1 and 11A-11C, the method 100 at operation 128 fills each air gap 268 to form a silicide layer 280 over each epitaxial S/D feature 250, such that the silicide layer 280 wraps around the epitaxial S/D feature 250. In many embodiments, the silicide layer 280 includes nickel silicide, cobalt silicide, tungsten silicide, tantalum silicide, titanium silicide, platinum silicide, erbium silicide, palladium silicide, other suitable silicide, or combinations thereof. The silicide layer 280 is formed by a suitable method. In one example, a metal layer (e.g., nickel) may be deposited over the device 200 by a deposition process such as CVD, ALD, PVD, other suitable processes, or combinations thereof. Then, the device 200 is annealed to allow the metal layer and the semiconductor materials of the epitaxial S/D features 250 to react and form the silicide layer 280. Thereafter, the un-reacted metal layer is removed, leaving the silicide layer 280 over the epitaxial S/D features 250. In another example, a metal layer may be selectively deposited over the semiconductor materials of the epitaxial S/D features 250 by a suitable deposition method provided herein. Thereafter, the device 200 is annealed to form the silicide layer 280 over the epitaxial S/D features 250. In some embodiments, the silicide layer 280 completely fills the air gaps 268. In some examples, the silicide layer 280 is formed to have a thickness of about 2 nm to about 3 nm (same thickness as the layer 262), which may range from about 20% to about 50% of a gap distance between an epitaxial S/D feature 250 and its adjacent dielectric layer 220. As illustrated in FIG. 11A, a maximal or allowable thickness of the silicide layer 280 is determined by the total thickness of the disposable spacer layer 222 and the liner layer 228, which are disposed between the dielectric layer 220 and the epitaxial S/D feature 250.

Figure 11B:
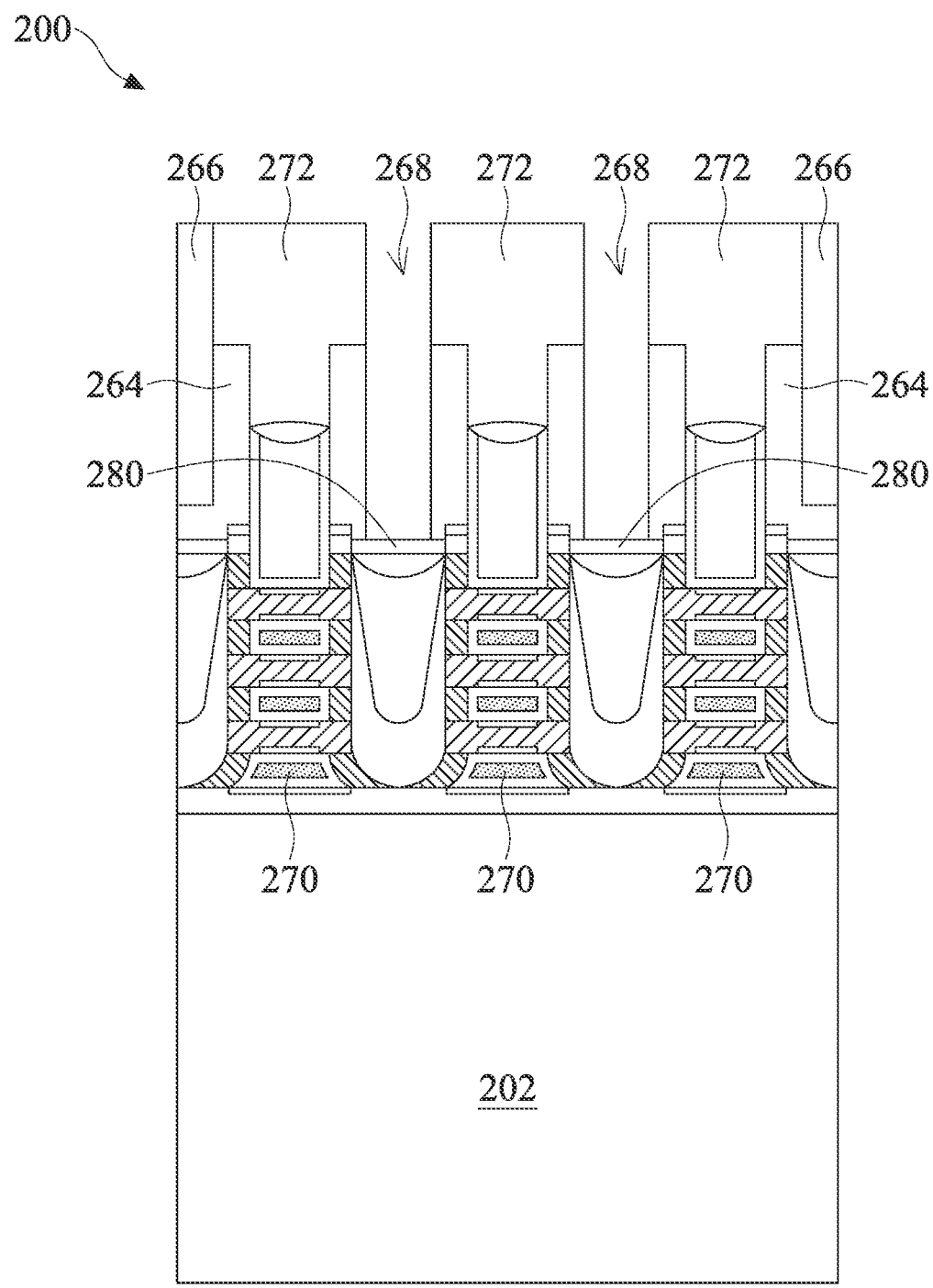
Figure 11C:
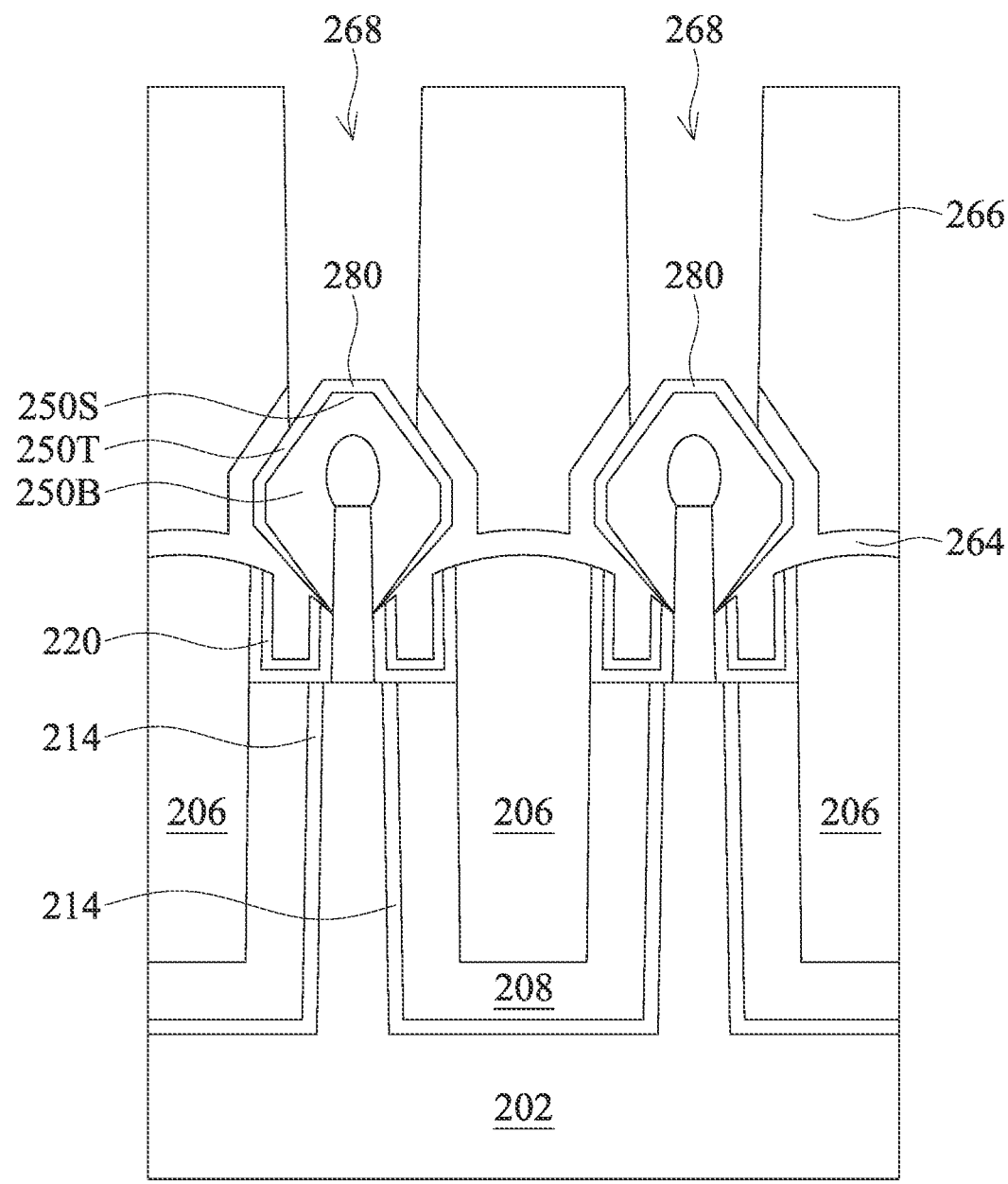
Figure 12A:
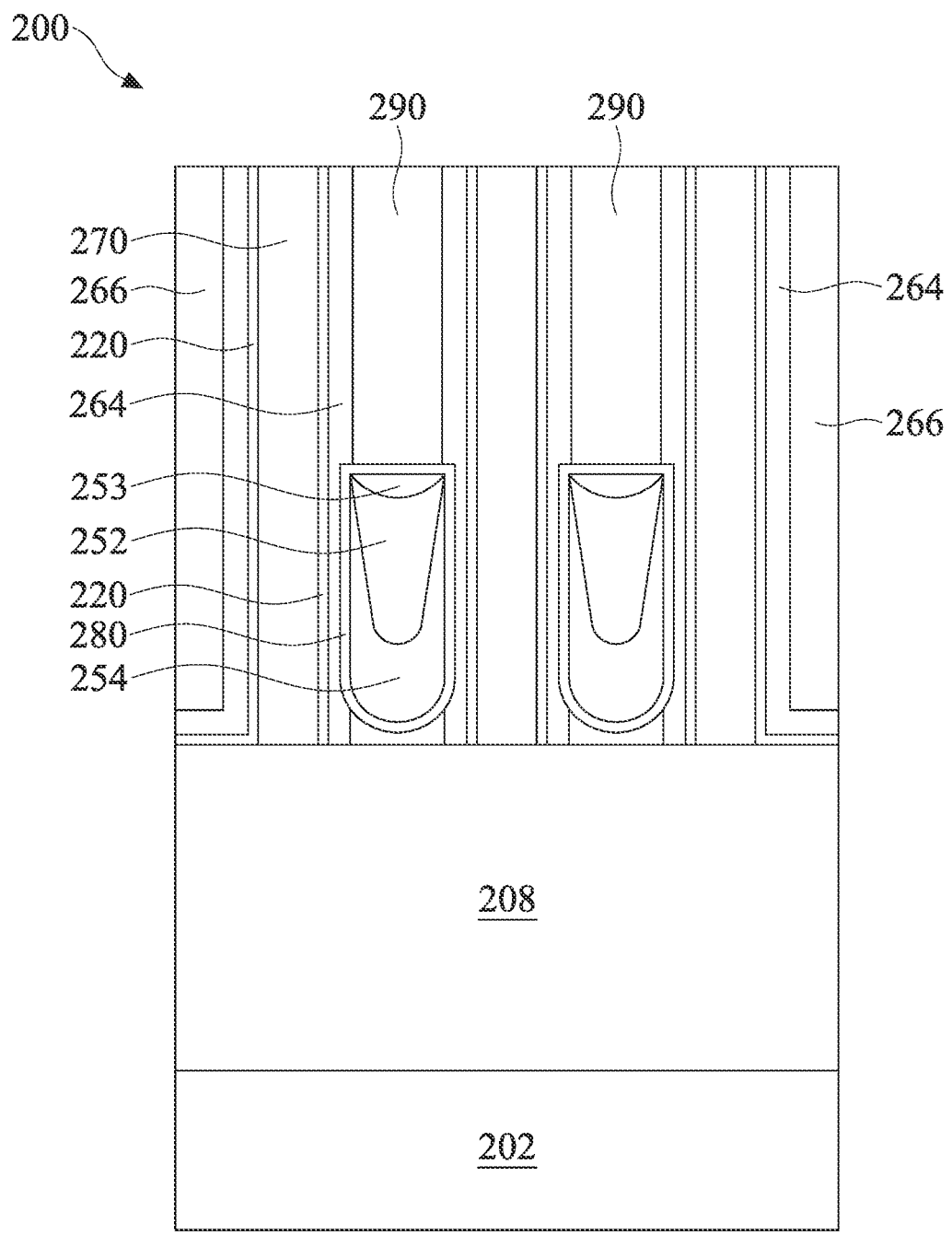
Figure 12B:
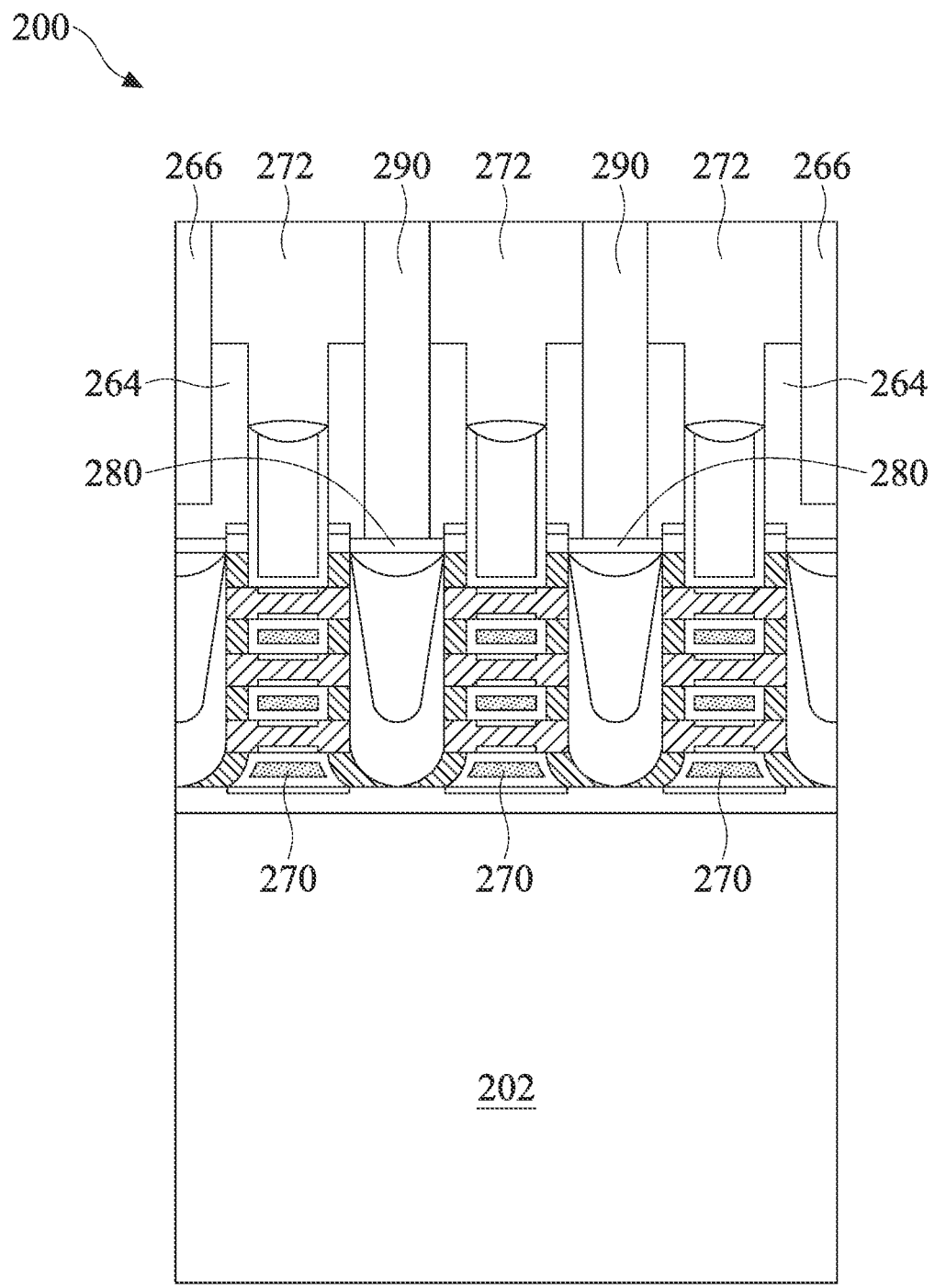
Figure 12C:
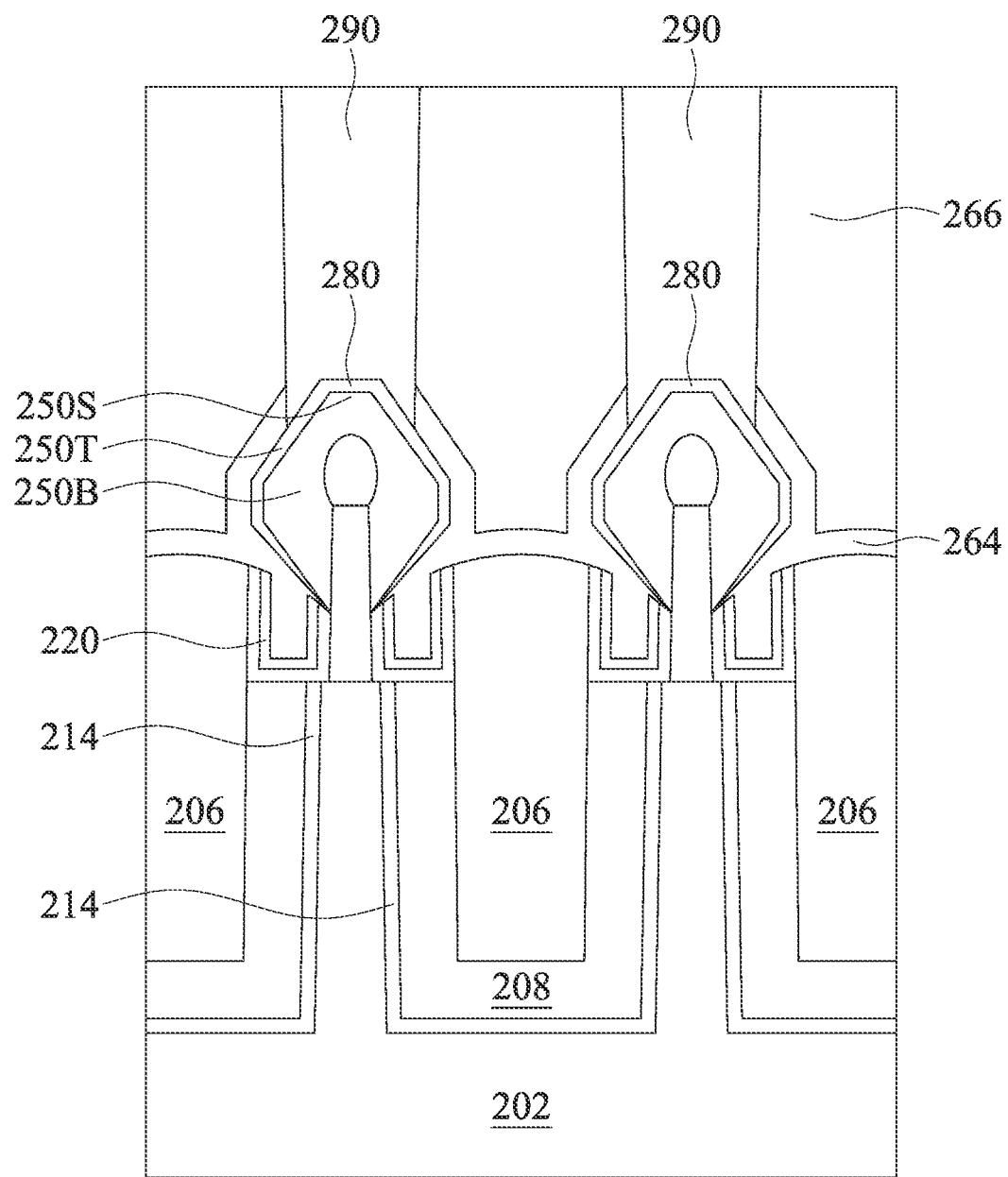

Notably, because the silicide layer 180 replaces the dummy epitaxial cap layer 262 which fully wraps around respective epitaxial S/D features 250, the silicide layer 280 also fully wraps around respective epitaxial S/D features 250. As shown in FIG. 11C, the silicide layer 280 is disposed not only on the top surface 250T of the epitaxial S/D features 250 but also at least on sidewall surfaces 250S of the epitaxial S/D features 250 (as well as on bottom surfaces 250B of the epitaxial S/D features 250 where the epitaxial S/D features 250 are suspended over adjacent isolation structures 208). For example, as shown in FIGS. 11A and 11C, a portion of the epitaxial S/D feature 250 horizontally extends over the isolation structure 208 (possibly extending over adjacent dielectric fins 206), and the silicide layer 280 covers at least sidewall surfaces 250S of the portion of the epitaxial S/D feature 250 that horizontally extends over the isolation structure 208. Advantageously, embodiments provided herein increase the contact area between the silicide layer 280 and the epitaxial S/D features 250, thereby reducing the contact resistance between the epitaxial S/D features 250 and S/D contacts 290 which are to be formed over the silicide layer 280. In addition, in the present disclosure the silicide layer 180 is formed after (rather than before) the gate replacement process, the silicide formation process is sometimes called a silicide-last process. One benefit of the silicide-last process is that the silicide layer 180 needs not go through the gate replacement processes, which may be conducted at elevated temperatures and/or may expose a silicide layer to various chemicals that could alter its properties. As a result, the silicide layer 180 may use materials more flexibly (e.g., more thermal budget) and may end up with more consistent electrical/mechanical properties.

As illustrated in FIG. 11A, the silicide layer 280 is disposed on the epitaxial S/D feature 250 and continuously wraps the extended portion of the epitaxial S/D feature 250 over the isolation structure 208. The spacer layer 264 includes a low-k dielectric material that separates the silicide layer from the gate structure, and covers sidewall surfaces of an extended portion of the silicide layer 280 that extends over the isolation structure 208. The spacer layer further includes a first portion that extends over a top surface of the portion of the silicide layer 280 and a second portion that extends underlying a bottom surface of the portion of the silicide layer 280. As illustrated in FIG. 11B, the silicide layer 280 extends on a top surface of a portion of the epitaxial S/D feature 250 over the semiconductor fin 204, and the spacer layer 264 further extends to cover a top surface of the portion of the silicide layer 280. As illustrated in FIG. 11C, the semiconductor device 200 further includes a dielectric fin 206 disposed adjacent to the semiconductor fin 204 and over the substrate 202 and the spacer layer 264 covers a top surface of the dielectric fin 206. The spacer layer fills in a recess between the semiconductor fin 204 and the dielectric fin 206, extends up to the silicide layer 280 on sidewall surfaces of the epitaxial S/D feature 250, and extends laterally to the top surface of the dielectric fin 206.

Referring to FIGS. 1 and 12A-12C, the method 100 at operation 130 forms S/D contacts 290 over the silicide layer 280 to be in electrical contact with corresponding epitaxial S/D features 250. Each S/D contact 290 may include one or more conductive layers and may be formed using any suitable methods such as ALD, CVD, PVD, plating, and/or other suitable processes. In some embodiments, each S/D contact 290 includes a seed metal layer and a fill metal layer. In various embodiments, the seed metal layer includes cobalt (Co), tungsten (W), ruthenium (Ru), nickel (Ni), other suitable metals, or combinations thereof. The fill metal layer may include copper (Cu), tungsten (W), aluminum (Al), cobalt (Co), other suitable materials, or combinations thereof. Although not depicted in FIGS. 12A-12C, it should be understood that, in embodiments where the dielectric fins 206 are not present, their places may have other suitable layers such as the spacer layer 264 and the ILD layer 266.

Referring to FIG. 1, the method 100 at operation 132 may perform additional processing steps. For example, additional vertical interconnect features such as vias, horizontal interconnect features such as lines, and/or multilayer interconnect features such as metal layers and interlayer dielectrics can be formed over the device 200. The various interconnect features may implement various conductive materials including copper (Cu), tungsten (W), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), their respective alloys, metal silicides, other suitable materials, or combinations thereof. The metal silicides may include nickel silicide, cobalt silicide, tungsten silicide, tantalum silicide, titanium silicide, platinum silicide, erbium silicide, palladium silicide, other suitable metal silicides, or combinations thereof.

Although not intended to be limiting, one or more embodiments of the present disclosure provide many benefits to a semiconductor device and the formation thereof. The present disclosure provides methods of forming a silicide layer over an epitaxial S/D feature. Embodiments of the present disclosure includes forming, after the gate replacement process, a silicide layer that wraps around the epitaxial S/D feature. Accordingly, the disclosed silicide layer reduces contact resistance between underlying epitaxial S/D features and overlying S/D contacts.

In one example aspect, the present disclosure provides a semiconductor device that includes a semiconductor fin disposed over a substrate; an isolation structure at least partially surrounding the fin; an epitaxial source/drain (S/D) feature disposed over the semiconductor fin, wherein an extended portion of the epitaxial S/D feature extends over the isolation structure; and a silicide layer disposed on the epitaxial S/D feature, the silicide layer continuously surrounding the extended portion of the epitaxial S/D feature over the isolation structure.

In another example aspect, the present disclosure provides a method of semiconductor fabrication. The method includes forming a semiconductor fin protruding from a substrate and a first gate stack on the semiconductor fin; forming a disposable spacer on sidewalls of the first gate stack; forming a recess in the semiconductor fin; growing an epitaxial source/drain (S/D) feature from the recess; removing the disposable spacer layer, resulting in an opening adjacent to the epitaxial S/D feature; forming a dummy epitaxial cap layer through the opening that wraps around an extended portion of the epitaxial S/D feature over an isolation feature; forming an interlayer dielectric layer (ILD) on the dummy epitaxial layer; patterning the ILD to forming a contact hole to expose the dummy epitaxial cap layer; selectively removing the dummy epitaxial cap layer through the contact hole, thereby exposing the epitaxial S/D feature; and forming a silicide layer that wraps around the extended portion of the epitaxial S/D feature.

In yet another example aspect, the present disclosure provides a method that includes forming a semiconductor fin over a substrate; forming a dummy gate stack that intersect the semiconductor fin; forming a disposable spacer on sidewalls of the dummy gate stack; removing a portion of the semiconductor fin to form a recess adjacent to the dummy gate stack; growing an epitaxial source/drain (S/D) feature from the recess; removing the disposable spacer layer, resulting in an opening adjacent to the epitaxial S/D feature; forming a dummy epitaxial cap layer through the opening that wraps around an extended portion of the epitaxial S/D feature over an isolation feature; forming an interlayer dielectric layer (ILD) on the dummy epitaxial layer; performing a gate replacement process to replace the dummy gate stack with a metal gate structure surrounding a plurality of channels stacked on the substrate; patterning the ILD to forming a contact hole to expose the dummy epitaxial cap layer; selectively removing the dummy epitaxial cap layer through the contact hole, thereby exposing the epitaxial S/D feature; and forming a silicide layer over the extended epitaxial S/D feature.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a semiconductor fin disposed over a substrate;
   an isolation structure at least partially surrounding the semiconductor fin;
   a source/drain (S/D) feature disposed over the semiconductor fin, wherein an extended portion of the S/D feature extends over the isolation structure, the extended portion includes a first, a second, and a third epitaxial layer, the second epitaxial layer being embedded between the first and third epitaxial layers; and
   a silicide layer disposed over the S/D feature, wherein the silicide layer wraps around the extended portion of the S/D feature such that the silicide layer is disposed along bottom and side surfaces of the first epitaxial layer.

2. The semiconductor device of claim 1, wherein the first, second, and third epitaxial layers are doped, and the first epitaxial layer is more heavily doped than the second and third epitaxial layers.

3. The semiconductor device of claim 2, wherein the third epitaxial layer has a greater amount of dopants than the second epitaxial layer.

4. The semiconductor device of claim 2, wherein the silicide layer is further disposed along a top surface of the third epitaxial layer.

5. The semiconductor device of claim 1, wherein the semiconductor device further comprises a spacer layer directly on a side portion and a bottom portion of the silicide layer.

6. The semiconductor device of claim 5, further comprising a dielectric fin disposed over the substrate and adjacent to the semiconductor fin, wherein the spacer layer covers a top surface of the dielectric fin.

7. The semiconductor device of claim 5, wherein the semiconductor device further comprises a gate structure disposed over a channel region of the semiconductor fin, wherein the spacer layer is disposed between a sidewall of the gate structure and the side portion of the silicide layer.

8. The semiconductor device of claim 7, wherein the semiconductor device further comprises an interlayer dielectric (ILD) layer directly contacting the spacer layer.

9. A semiconductor device, comprising:
   a semiconductor fin protruding from a substrate;
   a shallow trench isolation (STI) structure adjacent a sidewall of the semiconductor fin;
   an epitaxial source/drain (S/D) feature over the semiconductor fin, the epitaxial S/D feature having an extended portion directly above the STI structure;
   a silicide layer over the epitaxial S/D feature, the silicide layer fully wrapping around the extended portion of the epitaxial S/D feature; and
   a spacer layer wrapping around the silicide layer, wherein a portion of the spacer layer is disposed between the STI structure and the silicide layer.

10. The semiconductor device of claim 9, wherein the spacer layer covers an upper tilted side surface and a lower tilted side surface of the silicide layer.

11. The semiconductor device of claim 9, wherein the extended portion of the epitaxial S/D feature includes a first epitaxial layer and a second epitaxial layer, the second epitaxial layer is directly above the first epitaxial layer, and the first epitaxial layer has a greater amount of dopants than the second epitaxial layer.

12. The semiconductor device of claim 11, wherein the silicide layer covers side and bottom surfaces of the first epitaxial layer, and the silicide layer covers a top surface of the second epitaxial layer.

13. The semiconductor device of claim 9, further comprising a gate structure over a channel region of the semiconductor fin, wherein the spacer layer is disposed between the gate structure and a side surface of the silicide layer.

14. The semiconductor device of claim 9, further comprising:
   an interlayer dielectric (ILD) layer over the epitaxial S/D feature; and
   an S/D contact penetrating through the ILD layer and penetrating through a top portion of the spacer layer to contact a top surface of the silicide layer.

15. The semiconductor device of claim 9, wherein the sidewall of the semiconductor fin is lined with a fin spacer layer, and the fin spacer layer is in direct contact with the STI structure.

16. The semiconductor device of claim 9, further comprising a dielectric fin over the substrate, the dielectric fin in direct contact with side and bottom surfaces of the STI structure.

17. A semiconductor device, comprising:
   a first and a second semiconductor fin protruding from a substrate;
   an isolation feature over the substrate and over side surfaces of the first and second semiconductor fins;

a first and a second source/drain (S/D) feature over each of the respective first and second semiconductor fins, wherein the first and second S/D features have extended portions that extend directly above the isolation feature; and a first and a second silicide layer over each of the respective first and second S/D features, wherein each of the first and second silicide layers fully wraps around the extended portions of each of the first and second S/D features, wherein each of the extended portions of the first and second S/D features includes a plurality of epitaxial layers having different dopant concentrations.

18. The semiconductor device of claim 17, further comprising a spacer layer in direct contact with each of the first and second silicide layers, the spacer layer being disposed over side surfaces of the first and second silicide layers.

19. The semiconductor device of claim 18, further comprising:

a dielectric fin over the isolation feature and disposed between the first and second semiconductor fins; and an interlayer dielectric (ILD) layer over the dielectric fin, wherein the spacer layer separates the dielectric fin from the ILD layer.

20. The semiconductor device of claim 18, further comprising a first gate structure over a channel region of the first semiconductor fin, wherein the spacer layer is disposed between the first gate structure and the first silicide layer along a lengthwise direction of the first semiconductor fin.

* * * * *